(12) United States Patent
Chang

(10) Patent No.: US 12,512,165 B2
(45) Date of Patent: Dec. 30, 2025

(54) SENSING APPARATUS FOR NON-VOLATILE MEMORY

(71) Applicant: eMemory Technology Inc., Hsin-Chu (TW)

(72) Inventor: Che-Wei Chang, Hsinchu County (TW)

(73) Assignee: EMEMORY TECHNOLOGY INC., Hsin-Chu (TW)

(*) Notice: Subject to any disclaimer, the term of this patent is extended or adjusted under 35 U.S.C. 154(b) by 121 days.

(21) Appl. No.: 18/656,630

(22) Filed: May 7, 2024

(65) Prior Publication Data

US 2025/0124986 A1   Apr. 17, 2025

Related U.S. Application Data

(60) Provisional application No. 63/543,748, filed on Oct. 12, 2023.

(51) Int. Cl.
*G11C 7/00* (2006.01)
*G11C 16/20* (2006.01)
*G11C 16/26* (2006.01)
*G11C 16/32* (2006.01)

(52) U.S. Cl.
CPC ............ *G11C 16/26* (2013.01); *G11C 16/20* (2013.01); *G11C 16/32* (2013.01)

(58) Field of Classification Search
CPC ....... G11C 7/1051; G11C 7/22; G11C 7/1072; G11C 7/1006; G11C 7/1066
USPC .......................................... 365/189.15, 207
See application file for complete search history.

(56) References Cited

U.S. PATENT DOCUMENTS

| 8,531,865 | B2 | 9/2013 | Hosono et al. |
| 9,001,588 | B2* | 4/2015 | Kim ............... G11C 16/28 365/208 |
| 2023/0197165 | A1 | 6/2023 | Chang |

FOREIGN PATENT DOCUMENTS

TW         202326737 A      7/2023

OTHER PUBLICATIONS

Office Action issued by Taiwan Intellectual Property Office on Apr. 22, 2025.

* cited by examiner

*Primary Examiner* — Son T Dinh
(74) *Attorney, Agent, or Firm* — WPAT, PC

(57) ABSTRACT

A sensing apparatus for a non-volatile memory includes two current mirrors, three switches, a voltage control circuit and a judging circuit. The input terminal of the first current mirror receives a reference current. A mirroring terminal of the first current mirror is connected with a data line. The first switch is connected between the data line and the voltage control circuit. The second switch is connected between the data line and a ground voltage. The third switch is connected between the voltage control circuit and a supply voltage. The input terminal of the second current mirror receives a bias current. The mirroring terminal of the second current mirror is connected with the judging node. The voltage control circuit and the judging circuit are connected with the judging node.

25 Claims, 9 Drawing Sheets

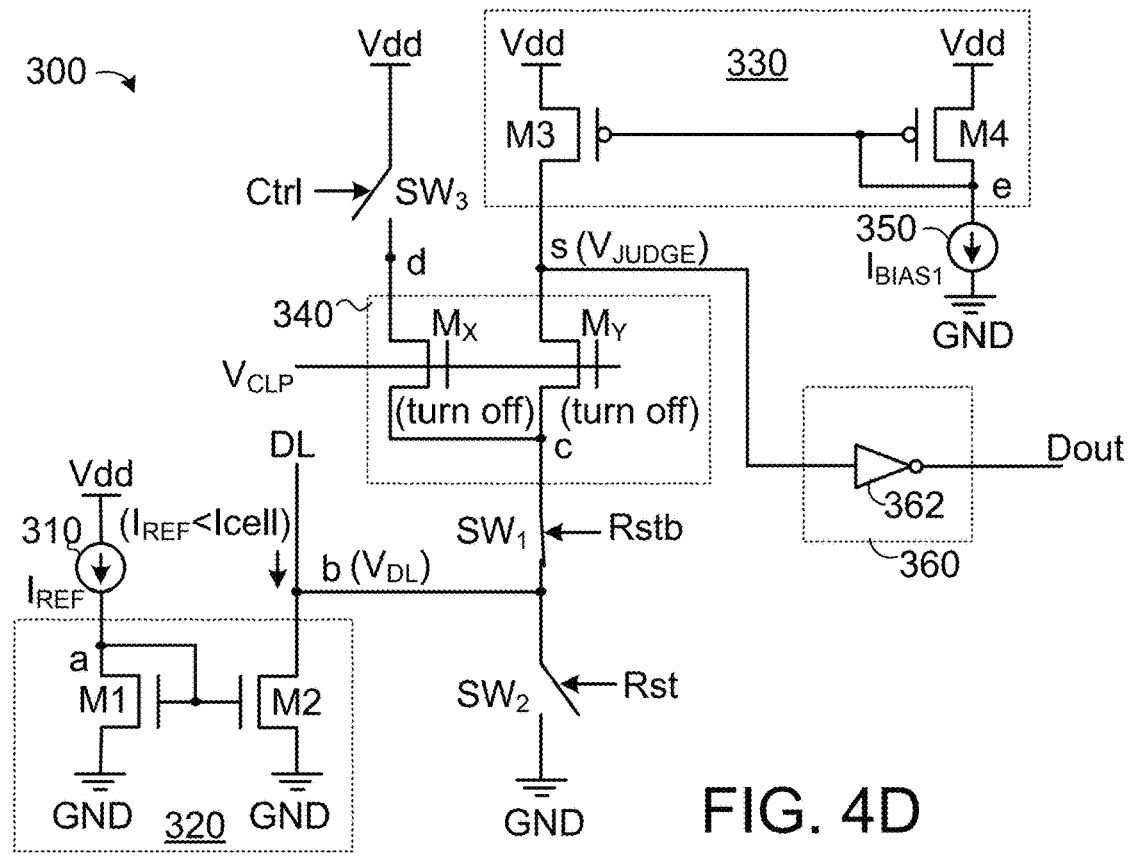
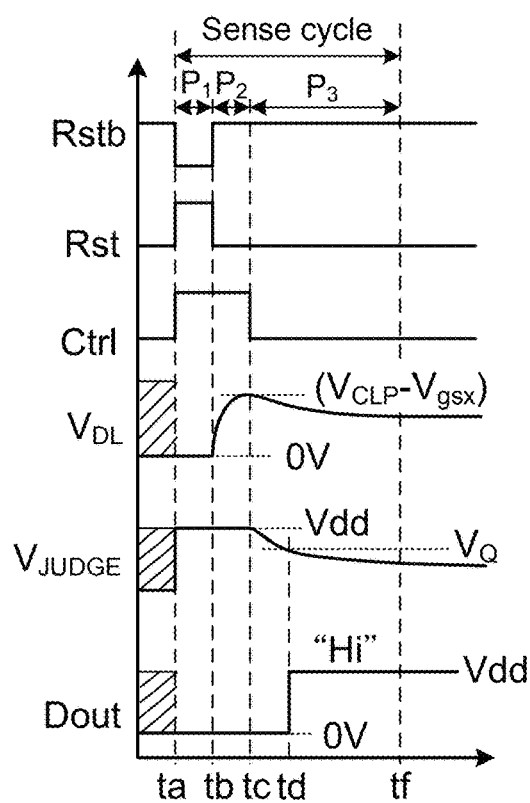
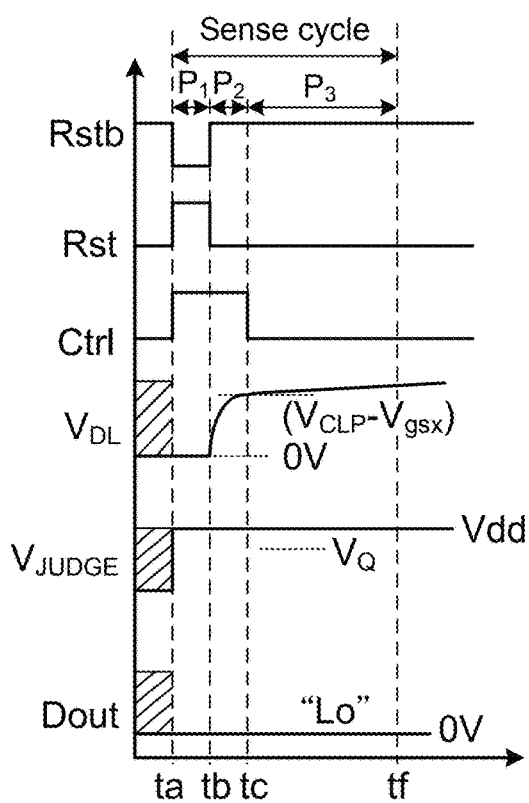
FIG. 4D
FIG. 4E
FIG. 4F

SENSING APPARATUS FOR NON-VOLATILE MEMORY

This application claims the benefit of U.S. provisional application Ser. No. 63/543,748, filed Oct. 12, 2023, the subject matter of which is incorporated herein by reference.

FIELD OF THE INVENTION

The present invention relates to a sensing apparatus, and more particularly to a sensing apparatus for a non-volatile memory.

BACKGROUND OF THE INVENTION

As is well known, non-volatile memories have been widely used in a variety of electronic devices such as SD cards or solid state drives (SSDs). Generally, the non-volatile memory comprises a memory array, and the memory array comprises plural memory cells. Each memory cell comprises a floating gate transistor. The floating gate transistor of each memory cell has a floating gate to store hot carriers. The storing state of the floating gate transistor may be determined according to the amount of the stored hot carriers. Moreover, the floating gate transistor is also referred as a storage transistor.

Generally, after the hot carriers are injected into the floating gate transistor, a threshold voltage ($V_{TH}$) of the floating gate transistor is changed according to the amount of the injected hot carriers. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

During a program cycle of the non-volatile memory, the threshold voltage of the floating gate transistor may be changed by controlling the amount of hot carriers to be injected into the floating gate. During a sense cycle of the non-volatile memory, a read voltage is provided to the floating gate transistor, and thus a cell current (also referred as a read current) is generated. According to the magnitude of the cell current, the storing state (e.g., an on state or an off state) of the floating gate transistor of the memory cell can be realized.

For example, if the read voltage is provided to the floating gate transistor with the lower threshold voltage, the floating gate transistor is in the on state to generate a higher cell current. Whereas, if the read voltage is provided to the floating gate transistor with the higher threshold voltage, the floating gate transistor is in the off state to generate a nearly-zero cell current. That is, during the sense cycle, the on-state memory cell generates a higher cell current, but the off-state memory cell generates a lower cell current.

Moreover, the non-volatile memory further comprises a sensing apparatus for receiving the cell current from the memory cell, thereby judging the storing state of the memory cell.

SUMMARY OF THE INVENTION

An embodiment of the present invention provides a sensing apparatus for a non-volatile memory. The non-volatile memory includes a memory cell. The memory cell is coupled with a data line during a sense cycle. The sensing apparatus includes a first current mirror, a first switch, a second switch, a voltage control circuit, a third switch, a second current mirror and a judging circuit. An input terminal of the first current mirror is connected with the first node to receive a reference current. A mirroring terminal of the first current mirror is connected with a second node. The second node is connected with the data line. A first terminal of the first switch is connected with the second node. A second terminal of the first switch is connected with a third node. A control terminal of the first switch receives an inverted reset pulse. A first terminal of the second switch is connected with the second node. A second terminal of the second switch receives a ground voltage. A control terminal of the second switch receives a reset pulse. The voltage control circuit receives a clamping voltage. The voltage control circuit is connected with the third node, a fourth node and a judging node. A first terminal of the third switch is connected with the fourth node. A second terminal of the third switch receives the supply voltage. A control terminal of the third switch receives a control signal. An input terminal of the second current mirror is connected with a fifth node to receive a first bias current. A mirroring terminal of the second current mirror is connected with the judging node. An input terminal of the judging circuit is connected with the judging node. An output terminal of the judging circuit generates an output data according to a judging voltage at the judging node.

An embodiment of the present invention provides a sensing apparatus for a non-volatile memory. The non-volatile memory includes a memory cell. The memory cell is coupled with a data line during a sense cycle. The sensing apparatus includes a first current mirror, a first switch, a second switch, a voltage control circuit, a second current mirror and a judging circuit. The first current mirror is connected with a first node and a second node. The first current mirror controls a first current flowing from the second node according to a reference current flowing through the first node. The second node is connected with the data line. The first switch is connected between the second node and a third node. A control terminal of the first switch receives an inverted reset pulse. The second switch is connected between the second node and a ground terminal. The control terminal of the second switch receives a reset pulse. The voltage control circuit is connected with the third node and a judging node. The voltage control circuit conducts a current in a one-way direction from the judging node to the third node in a sensing phase of the sense cycle according to a magnitude relationship between the reference current and a cell current in the data line. The second current mirror is connected with the judging node and a fourth node. The second current mirror controls a second current flowing to the judging node according to a first bias current flowing through the fourth node. The judging circuit is connected with the judging node. The judging circuit generates an output data according to a judging voltage at the judging node.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 4A, 4B, 4C and 4D are schematic circuit diagrams illustrating the operations of the sensing apparatus according to the first embodiment of the present invention during the sense cycle;

FIGS. 4E and 4F are schematic timing waveform diagrams illustrating associated signals of the sensing apparatus during the sense cycle;

DETAILED DESCRIPTION OF PREFERRED EMBODIMENTS

Figure 1:
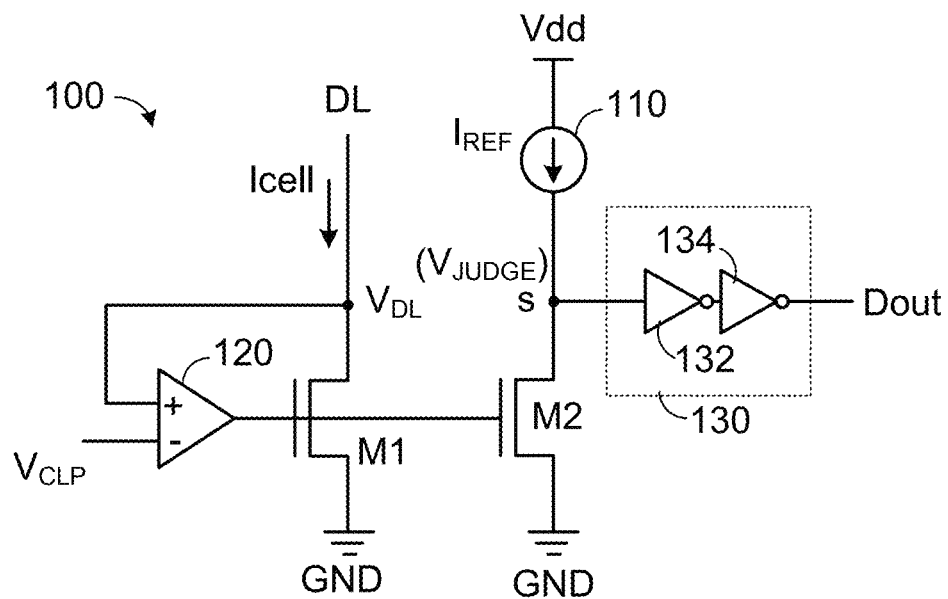
FIG. 1 is a schematic circuit diagram illustrating a sensing apparatus.

FIG. 1 is a schematic circuit diagram illustrating a sensing apparatus 100. As shown in FIG. 1, the sensing apparatus 100 comprises a transistor M1, a transistor M2, a current source 110, an operational amplifier 120 and a judging circuit 130.

The transistor M1 and the operational amplifier 120 are collaboratively defined as a voltage clamping circuit. The drain terminal of the transistor M1 is connected with a data line DL to receive a cell current Icell from the memory cell. The gate terminal of the transistor M1 is connected with the output terminal of the operational amplifier 120. The source terminal of the transistor M1 is connected with a ground terminal to receive a ground voltage GND. The inverting input terminal of the operational amplifier 120 receives a clamping voltage $V_{CLP}$. The non-inverting input terminal of the operational amplifier 120 is connected with the drain terminal of the transistor M1. Consequently, when the voltage clamping circuit is in a normal working state, the magnitude of a data line voltage $V_{DL}$ at the drain terminal of the transistor M1 is equal to the magnitude of the clamping voltage $V_{CLP}$.

The current source 110 is connected between a supply voltage Vdd and a judging node s. The current source 110 generates a reference current $I_{REF}$. The drain terminal of the transistor M2 is connected with the judging node s. The drain terminal of the transistor M2 receives the reference current $I_{REF}$. The gate terminal of the transistor M2 is connected with the gate terminal of the transistor M1. The source terminal of the transistor M2 is connected with the ground terminal to receive the ground voltage GND. The supply voltage Vdd is higher than the clamping voltage $V_{CLP}$. The clamping voltage $V_{CLP}$ is higher than the ground voltage GND. For example, the supply voltage Vdd is in the range between 3.3V and 5V, and the clamping voltage $V_{CLP}$ is in the range between 0.2V and 0.4V.

The input terminal of the judging circuit 130 is connected with the judging node s to receive a judging voltage $V_{JUDGE}$ from the judging node s. The output terminal of the judging circuit 130 generates an output data Dout. For example, the judging circuit 130 comprises two NOT gates 132 and 134. The two NOT gates 132 and 134 are serially connected between the input terminal and the output terminal of the judging circuit 130. Consequently, during the sense cycle, the memory cell is judged to be in an on state or an off state according to the output data Dout of the judging circuit 130.

During the sense cycle, the data line DL is connected with the memory cell to receive the cell current Icell. If the magnitude of the cell current Icell on the data line DL is higher than the magnitude of the reference current $I_{REF}$, the judging voltage $V_{JUDGE}$ is pulled down to the ground voltage GND. Consequently, the judging circuit 130 issues the output data Dout with a low logic level to indicate that the memory cell is in the on state. Whereas, if the magnitude of the cell current Icell in the data line DL is lower than the magnitude of the reference current $I_{REF}$, the judging voltage $V_{JUDGE}$ is pulled up to the supply voltage Vdd. Consequently, the judging circuit 130 issues the output data Dout with a high logic level to indicate that the memory cell is in the off state.

It is noted that the example of the judging circuit 130 is not restricted. For example, the judging circuit 130 may comprise one or more than two NOT gates, which are serially connected between the input terminal and the output terminal of the judging circuit 130.

From the above discussions, the sensing apparatus 100 can judge the storing state of the memory cell according to the magnitude of the cell current Icell generated by the memory cell.

As mentioned above, the operational amplifier 120 is connected with the data line DL. Since the operational amplifier 120 is connected as a negative feedback amplifier, the noise is amplified according to the high gain of the operational amplifier, and the judging voltage $V_{JUDGE}$ at the judging node s is influenced. For example, the ground noise is amplified by the amplifier. Consequently, the judging voltage $V_{JUDGE}$ at the judging node s is not stable. Due to the unstable judging voltage $V_{JUDGE}$, the judging circuit 130 may be suffered from misjudgment.

Figure 2:
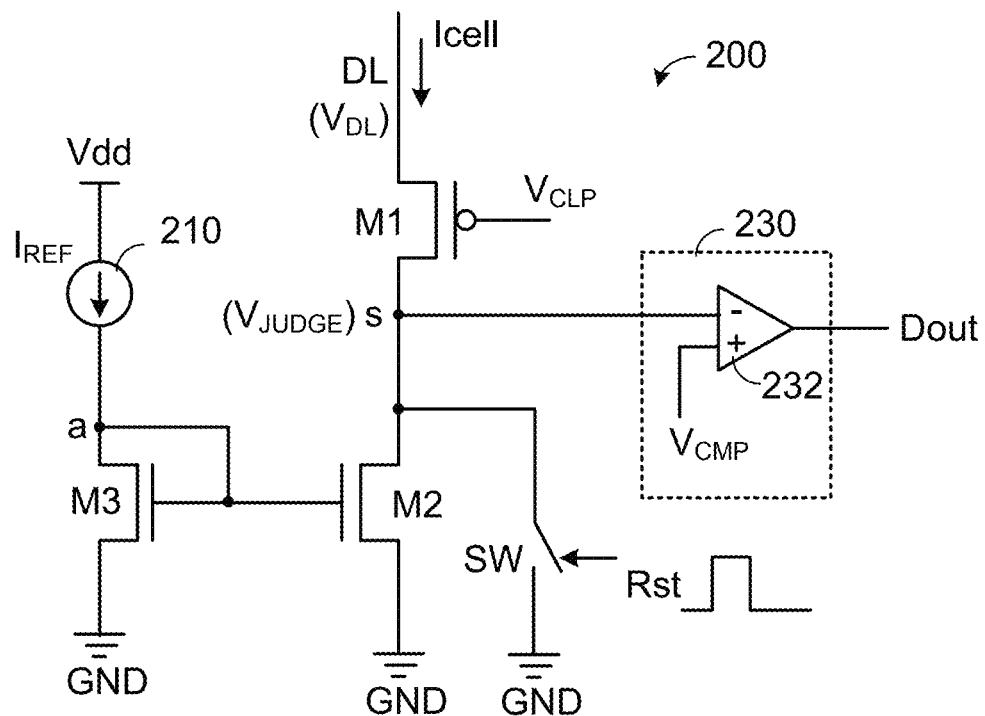
FIG. 2 is a schematic circuit diagram illustrating another sensing apparatus.

FIG. 2 is a schematic circuit diagram illustrating another sensing apparatus 200. The sensing apparatus 200 is applied to a non-volatile memory (not shown). As shown in FIG. 2, the sensing apparatus 200 comprises a transistor M1, a transistor M2, a transistor M3, a current source 210, a switch SW and a judging circuit 230.

The source terminal of the transistor M1 is connected with a data line DL to receive a cell current Icell from a memory cell of the non-volatile memory. The gate terminal of the transistor M1 receives a clamping voltage $V_{CLP}$. The drain terminal of the transistor M1 is connected with a judging node s. During a sense cycle, the memory cell is connected with the data line DL, and the magnitude of a data line voltage $V_{DL}$ is equal to $(V_{CLP}-V_T)$, wherein $V_T$ is the threshold voltage of the transistor M1.

The current source 210 is connected between a supply voltage Vdd and a node a. The current source 210 generates a reference current $I_{REF}$. The transistor M2 and the transistor M3 are collaboratively formed as a current mirror. The drain terminal of the transistor M2 is connected with the judging node s. The gate terminal of the transistor M2 is connected with the node a. The source terminal of the transistor M2 receives a ground voltage GND. The drain terminal of the transistor M3 is connected with the node a. The gate terminal of the transistor M3 is connected with the node a. The source terminal of the transistor M3 receives the ground voltage GND.

The first terminal of the switch SW is connected with the judging node s. The second terminal of the switch SW is connected with the ground terminal to receive the ground voltage GND. The control terminal of the switch SW receives a reset pulse Rst.

The input terminal of the judging circuit 230 is connected with the judging node s to receive a judging voltage $V_{JUDGE}$ from the judging node s. The output terminal of the judging circuit 230 generates an output data Dout.

In an embodiment, the judging circuit 230 comprises a comparator 232. The inverting input terminal of the comparator 232 is connected with the judging node s to receive the judging voltage $V_{JUDGE}$. The non-inverting input terminal of the comparator 232 receives a comparison voltage $V_{CMP}$. The output terminal of the comparator 232 generates the output data Dout. The comparison voltage $V_{CMP}$ is higher than the ground voltage GND, and the comparison voltage $V_{CMP}$ is lower than the supply voltage Vdd.

In an initial stage of the sense cycle, the switch SW receives the reset pulse Rst. In response to the reset pulse Rst, the switch SW is in a closed state. Consequently, the judging voltage $V_{JUDGE}$ at the judging node s is discharged to the ground voltage GND. After the reset pulse Rst, the switch SW is in an opened state. Consequently, the magnitude of the judging voltage $V_{JUDGE}$ at the judging node s is changed according to the magnitude of the cell current Icell. Consequently, the storing state of the memory cell can be judged by the judging circuit 230 according to the magnitude of the judging voltage $V_{JUDGE}$.

For example, if the cell current Icell in the data line DL is higher than the reference current $I_{REF}$, the judging voltage $V_{JUDGE}$ is charged to the higher voltage (e.g., the supply voltage Vdd). The supply voltage Vdd is higher than the comparison voltage $V_{CMP}$. Consequently, the judging circuit 230 generates the output data Dout at a low logic level to indicate that the memory cell is in the on state. Whereas, if the cell current Icell in the data line DL is lower than the reference current $I_{REF}$, the judging voltage $V_{JUDGE}$ is maintained at the ground voltage GND. Consequently, the judging circuit 230 generates the output data Dout at a high logic level to indicate that the memory cell is in the off state.

It is noted that the example of the judging circuit 230 is not restricted. For example, in the judging circuit 230, the non-inverting input terminal of the comparator 232 is connected with the judging node s, and the inverting input terminal of the comparator 232 receives the comparison voltage $V_{CMP}$. Consequently, the judging circuit 230 generates the output data Dout at a low logic level to indicate that the memory cell is in the on state, and the judging circuit 230 generates the output data Dout at a high logic level to indicate that the memory cell is in the off state.

As shown in FIG. 2, the sensing apparatus 200 is not equipped with the operational amplifier. Consequently, the sensing apparatus 200 is less sensitive to the noise. Moreover, the transistor M1 is connected between the data line DL and the judging node s. Consequently, the gate-source voltage of the transistor M1 affects the read speed of the sensing apparatus 200. For example, it is assumed that the gate-source voltage of the transistor M1 is −1 V. Consequently, during the sense cycle, if the clamping voltage $V_{CLP}$ is the ground voltage GND (e.g., 0 V), the data line voltage $V_{DL}$ is 1 V. That is, $V_{DL}=V_{CLP}-V_{gs}=[0\ V-(-1\ V)]=1\ V$, in which $V_{gs}$ is the gate-source voltage of the transistor M1. Since the 1 V data line voltage $V_{DL}$ is too high, the read speed of the sensing apparatus 200 is adversely affected. Moreover, the variation of the pulse width of the reset pulse Rst influences the output data Dout of the sensing apparatus 200.

Figure 3:
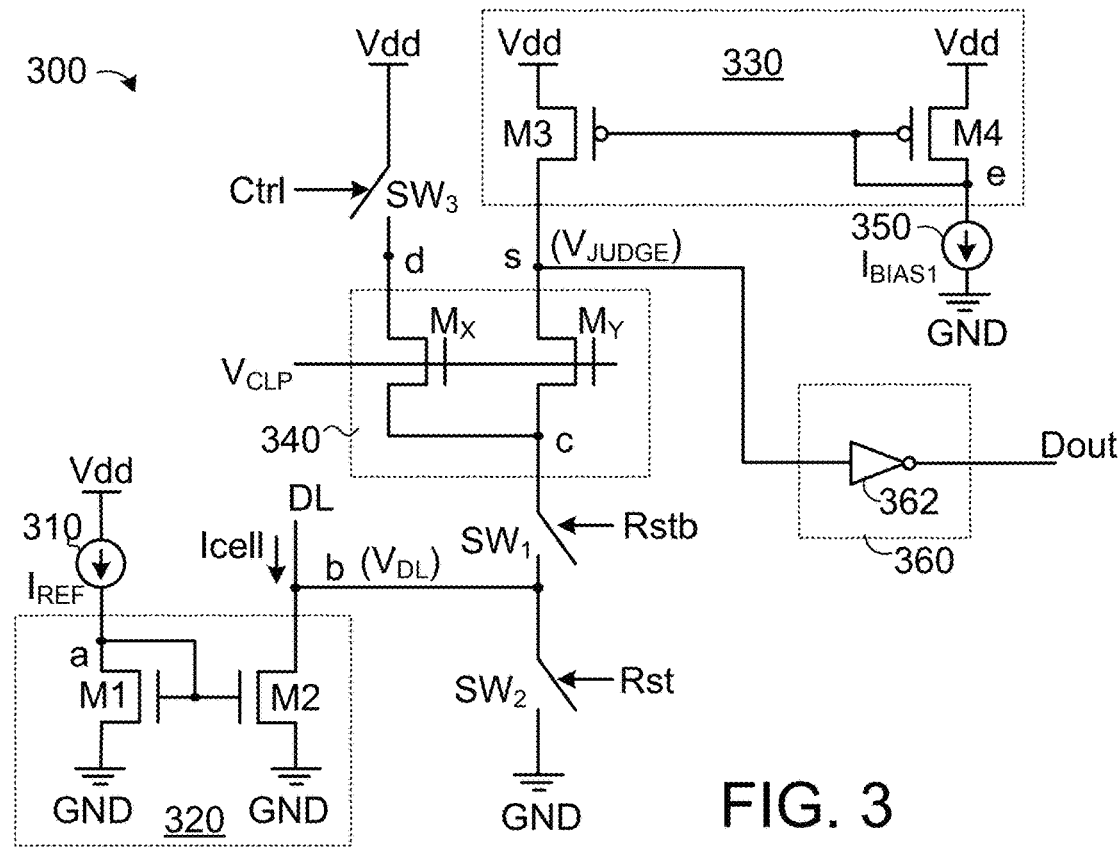
FIG. 3 is a schematic circuit diagram illustrating a sensing apparatus according to a first embodiment of the present invention.

FIG. 3 is a schematic circuit diagram illustrating a sensing apparatus 300 according to a first embodiment of the present invention. The sensing apparatus 300 comprises two current mirrors 320 and 330, three switches $SW_1$, $SW_2$ and $SW_3$, a voltage control circuit 340 and a judging circuit 360.

A data line DL is connected with a node b and provides a cell current Icell, which is generated by the memory cell in the non-volatile memory. That is, during the sense cycle, the memory cell in the non-volatile memory is coupled with the data line DL. Consequently, the sensing apparatus 300 can judge the storing state of the memory cell.

The current mirror 320 has an input terminal and a mirroring terminal. The input terminal of the current mirror 320 is connected with the node a. The input terminal of the current mirror 320 receives a reference current $I_{REF}$. The mirroring terminal of the current mirror 320 is connected with the node b. The current source 310 is connected between a supply voltage Vdd and the node a, thus connected to the input terminal of the current mirror 320 through the node a. The current source 310 generates the reference current $I_{REF}$. The current mirror 320 comprises transistors M1 and M2. The drain terminal of the transistor M1 is served as the input terminal of the current mirror 320. The drain terminal of the transistor M1 is connected with the node a. The gate terminal of the transistor M1 is connected with the node a. The source terminal of the transistor M1 is connected with a ground terminal to receive the ground voltage GND. The drain terminal of the transistor M2 is served as the mirroring terminal of the current mirror 320. The drain terminal of the transistor M2 is connected with the node b. The gate terminal of the transistor M2 is connected with the node a. The source terminal of the transistor M2 is connected with the ground terminal to receive the ground voltage GND.

In an embodiment, the magnitude of the reference current $I_{REF}$ is about 4 μA to 5 μA, and the sizes of the transistors M1 and M2 are identical. The current in the mirroring terminal of the current mirror 320 flows from the node b to the transistor M2. In another embodiment, the sizes of the transistors M1 and M2 are different. Under this circumstance, the size ratio of the transistor M1 to the transistor M2 substantially equal to the magnitude ratio of the reference current $I_{REF}$ to the current flowing through the mirroring terminal of the current mirror 320.

The first terminal of the switch $SW_1$ is connected with the node b. The second terminal of the switch $SW_1$ is connected with the node c. The control terminal of the switch $SW_1$ receives an inverted reset pulse Rstb. The first terminal of the switch $SW_2$ is connected with the node b. The second terminal of the switch $SW_2$ receives the ground voltage GND. The control terminal of the switch $SW_2$ receives a reset pulse Rst. The resets pulse Rst and the inverted reset pulse Rstb are complementary to each other. The first terminal of the switch $SW_3$ receives the supply voltage Vdd. The second terminal of the switch $SW_3$ is connected with the node d. The control terminal of the switch $SW_3$ receives a control signal Ctrl.

The current mirror 330 has an input terminal and a mirroring terminal. The input terminal of the current mirror 330 is connected with the node e. The input terminal of the current mirror 330 receives a bias current $I_{BIAS1}$. The mirroring terminal of the current mirror 330 is connected with a judging node s. A current sink 350 is connected between the node e and the ground terminal, thus connected to the input terminal of the current mirror 330 through the node e. The current sink 350 generates the bias current $I_{BIAS1}$. Moreover, the current mirror 330 comprises transistors M3 and M4. The drain terminal of the transistor M3 is served as the mirroring terminal of the current mirror 330. The drain terminal of the transistor M3 is connected with the judging node s. The gate terminal of the transistor M3 is connected with the node e. The source terminal of the transistor M3 receives the supply voltage Vdd. The drain terminal of the transistor M4 is served as the input terminal of the current mirror 330. The drain terminal of the transistor M4 is connected with the node e. The gate terminal of the transistor M4 is connected with the node e. The source terminal of the transistor M4 receives the supply voltage Vdd.

In an embodiment, the magnitude of the bias current $I_{BIAS1}$ is about 1 μA, and the sizes of the transistors M3 and M4 are identical. The current in the mirroring terminal of the current mirror 330 flows from the transistor M3 to the judging node s. In another embodiment, the sizes of the transistors M3 and M4 are different. Under this circumstance, the size ratio of the transistor M3 to the transistor M4 substantially equal to the magnitude ratio of the bias current $I_{BIAS1}$ to the current flowing through the mirroring terminal of the current mirror 330.

The input terminal of the judging circuit 360 is connected with the judging node s to receive a judging voltage $V_{JUDGE}$ from the judging node s. The output terminal of the judging circuit 360 generates the output data Dout. For example, the judging circuit 360 comprises a NOT gate 362. The NOT gate 362 is connected between the input terminal and the output terminal of the judging circuit 360. Consequently, during the sense cycle, the memory cell is judged to be in an on state or an off state according to the output data Dout of the judging circuit 360. It is noted that the number of the NOT gate in the judging circuit 360 is not restricted. For example, in some other embodiments, the judging circuit 360 comprises plural NOT gates. The plural NOT gates are serially connected between the input terminal and the output terminal of the judging circuit 360.

The voltage control circuit 340 comprises plural voltage control devices $M_X$ and $M_Y$. The control terminal of the voltage control device $M_X$ receives a clamping voltage $V_{CLP}$. The first terminal of the voltage control device $M_X$ is connected with the node d. The second terminal of the voltage control device $M_X$ is connected with the node c. The control terminal of the voltage control device $M_Y$ receives the clamping voltage $V_{CLP}$. The first terminal of the voltage control device $M_Y$ is connected with the judging node s. The second terminal of the voltage control device $M_Y$ is connected with the node c. In addition, the threshold voltage of the voltage control device $M_X$ is lower than the threshold voltage of the voltage control device $M_Y$.

In an embodiment, each of the voltage control devices $M_X$ and $M_Y$ comprises a single transistor. In addition, the sizes of the two transistors in the voltage control devices $M_X$ and $M_Y$ is X:Y, wherein X>Y and X and Y are positive numbers. The drain terminal of the voltage control device $M_X$ is connected with the node d. The source terminal of the voltage control device $M_X$ is connected with the node c. The gate terminal of the voltage control device $M_X$ receives the clamping voltage $V_{CLP}$. The drain terminal of the voltage control device $M_Y$ is connected with the judging node s. The source terminal of the voltage control device $M_Y$ is connected with the node c. The gate terminal of the voltage control device $M_Y$ receives the clamping voltage $V_{CLP}$. That is, the size of the voltage control device $M_X$ is larger than the size of the voltage control device $M_Y$. Consequently, the threshold voltage of the voltage control device $M_X$ is lower than the threshold voltage of the voltage control device $M_Y$.

In another embodiment, each of the voltage control devices $M_X$ and $M_Y$ comprises plural transistors. For example, the voltage control device $M_X$ comprises J transistors, and the voltage control device $M_Y$ comprises K transistors. The drain terminals of the J transistors in the voltage control device $M_X$ are connected with the node d. The source terminals of the J transistors in the voltage control device $M_X$ are connected with the node c. The gate terminals of the J transistors in the voltage control device $M_X$ receive the clamping voltage $V_{CLP}$. The drain terminals of the K transistors in the voltage control device $M_Y$ are connected with the judging node s. The source terminals of the K transistors in the voltage control device $M_Y$ are connected with the node c. The gate terminals of the K transistors in the voltage control device $M_Y$ receive the clamping voltage $V_{CLP}$. In addition, the sizes of the J transistors and the K transistors in the voltage control devices $M_X$ and $M_Y$ are identical, wherein J>K, and J and K are positive integers. Since the number of the transistors in the voltage control device $M_X$ is larger than the number of the transistors in the voltage control device $M_Y$, the threshold voltage of the voltage control device $M_X$ is lower than the threshold voltage of the voltage control device $M_Y$.

It is noted that the numbers of the transistors in the voltage control devices $M_X$ and $M_Y$ are not restricted. For example, in a variant example, the voltage control device $M_Y$ comprises a single transistor, and the voltage control device $M_X$ comprises plural transistors. By properly designing the sizes and/or numbers of the transistors, the threshold voltage of the voltage control device $M_X$ is lower than the threshold voltage of the voltage control device $M_Y$.

FIGS. 4A, 4B, 4C and 4D are schematic circuit diagrams illustrating the operations of the sensing apparatus 300 according to the first embodiment of the present invention during the sense cycle. FIGS. 4E and 4F are schematic timing waveform diagrams illustrating associated signals of the sensing apparatus 300 during the sense cycle.

In case that the storing state of the memory cell connected with the data line DL is the off state, the operations of the sensing apparatus 300 can be shown in FIGS. 4A, 4B, 4C and 4E. Generally, a sense cycle includes a reset phase $P_1$, a voltage control phase $P_2$ and a sense phase $P_3$. During one sense cycle, the sensing apparatus 300 judges the storing state of one memory cell. The sensing apparatus 300 can judge the storing states of plural memory cells in plural consecutive sense cycles.

Figure 4A:
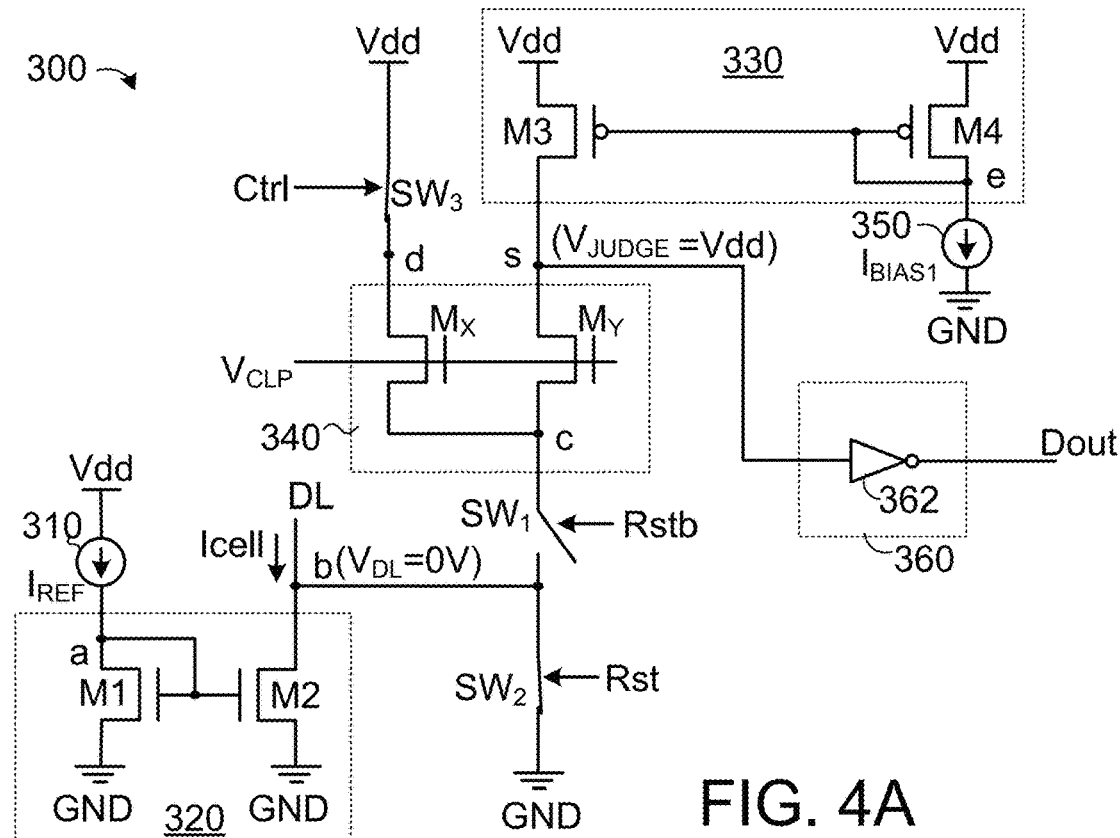

Please refer to FIGS. 4A and 4E. In the time interval between the time point ta and the time point tb (i.e., the reset phase $P_1$ of the sense cycle), the switch $SW_2$ receives the reset pulse Rst. In response to the reset pulse Rst, the switch $SW_2$ is in the closed state (i.e., conducted state). Moreover, the switch $SW_1$ receives the inverted reset pulse Rstb. In response to the inverted reset pulse Rstb, the switch $SW_1$ is in the opened state (i.e., turned-off state). Moreover, the switch $SW_3$ receives the control signal Ctrl. In response to the control signal Ctrl, the switch $SW_3$ is in the closed state.

Please refer to FIG. 4E again. In the reset phase $P_1$ of the sense cycle, the data line voltage $V_{DL}$ of the data line DL (i.e., the voltage at the node b) is reset to the ground voltage GND. That is, $V_{DL}=0$ V. Moreover, since the switch $SW_1$ is in the opened state, the judging voltage $V_{JUDGE}$ is pulled up to the supply voltage Vdd. The voltage at the node c is reset to $(V_{CLP}-V_{gsx})$ by the voltage control circuit 340 according to the supply voltage Vdd, wherein $V_{gsx}$ is the gate-source voltage of the voltage control element $M_X$.

Figure 4B:
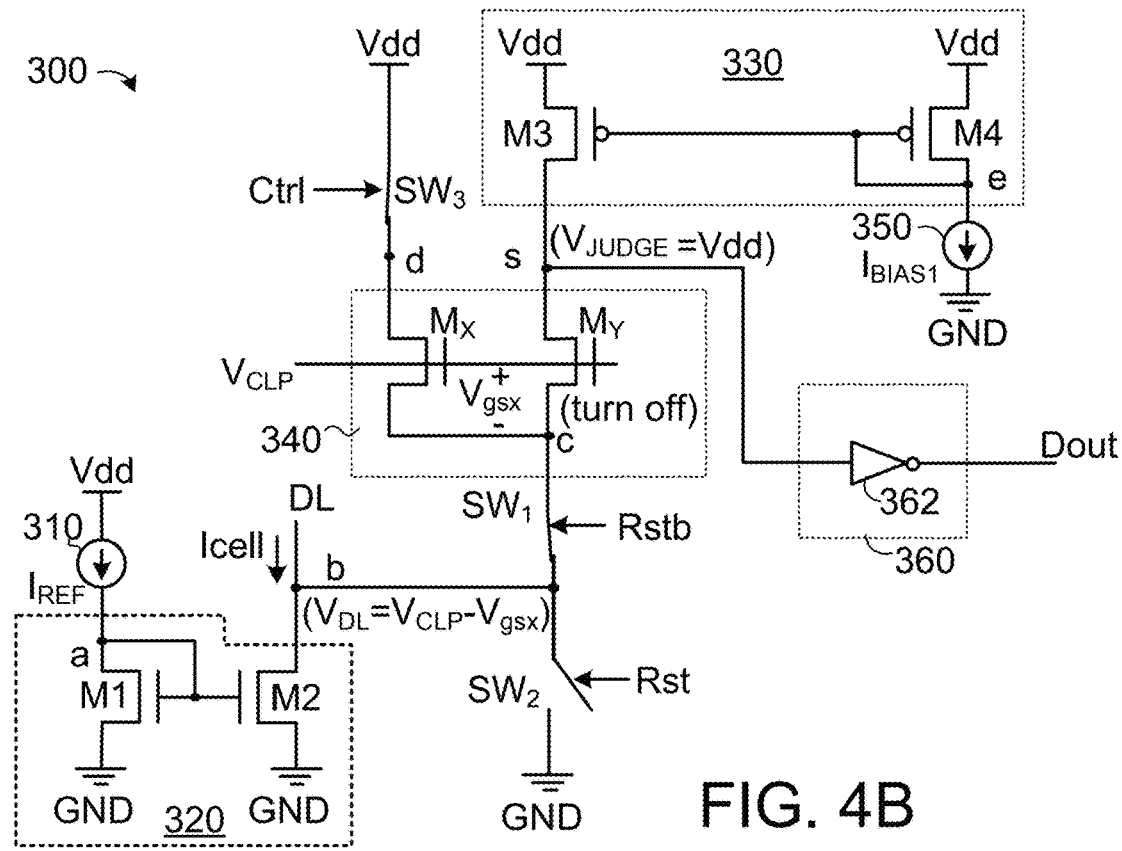

Please refer to FIGS. 4B and 4E. After the reset pulse Rst and in the time interval between the time point tb and the time point tc (i.e., the voltage control phase $P_2$ of the sense cycle), the switch $SW_1$ is in the closed state, the switch $SW_2$ is in the opened state, and the switch $SW_3$ is still in the closed state. Meanwhile, the voltage control device $M_X$ is turned on. In addition, a current path from the supply voltage Vdd through the switch $SW_3$, the voltage control device $M_X$ and the switch $SW_1$ is formed to charge the data line DL. Moreover, since the voltage control device $M_X$ receives the clamping voltage $V_{CLP}$, the data line voltage $V_{DL}$ of the data line DL (i.e., the voltage at the node b) is charged from the ground voltage (0 V) to $(V_{CLP}-V_{gsx})$, wherein $V_{gsx}$ is the gate-source voltage of the voltage control device $M_X$. In addition, the gate-source voltage of the voltage control device $M_X$ is approximately equal to the threshold voltage of the voltage control device $M_X$.

Since the gate-source voltage of the voltage control device $M_Y$ is equal to the gate-source voltage $V_{gsx}$ of the voltage control device $M_X$, which is smaller than the threshold voltage of the voltage control device $M_Y$, the voltage control device $M_Y$ is turned off. That is, in the voltage control phase $P_2$ of the sense cycle, the voltage control device $M_X$ is turned on, and the voltage control device $M_Y$ is turned off. Please refer to FIG. 4E. In the voltage control phase $P_2$ of the sense cycle, the data line voltage $V_{DL}$ of the data line DL (i.e., the voltage at the node b) and the voltage at the node c are charged to $(V_{CLP}-V_{gsx})$, and the judging voltage $V_{JUDGE}$ is maintained in the supply voltage Vdd.

Figure 4C:
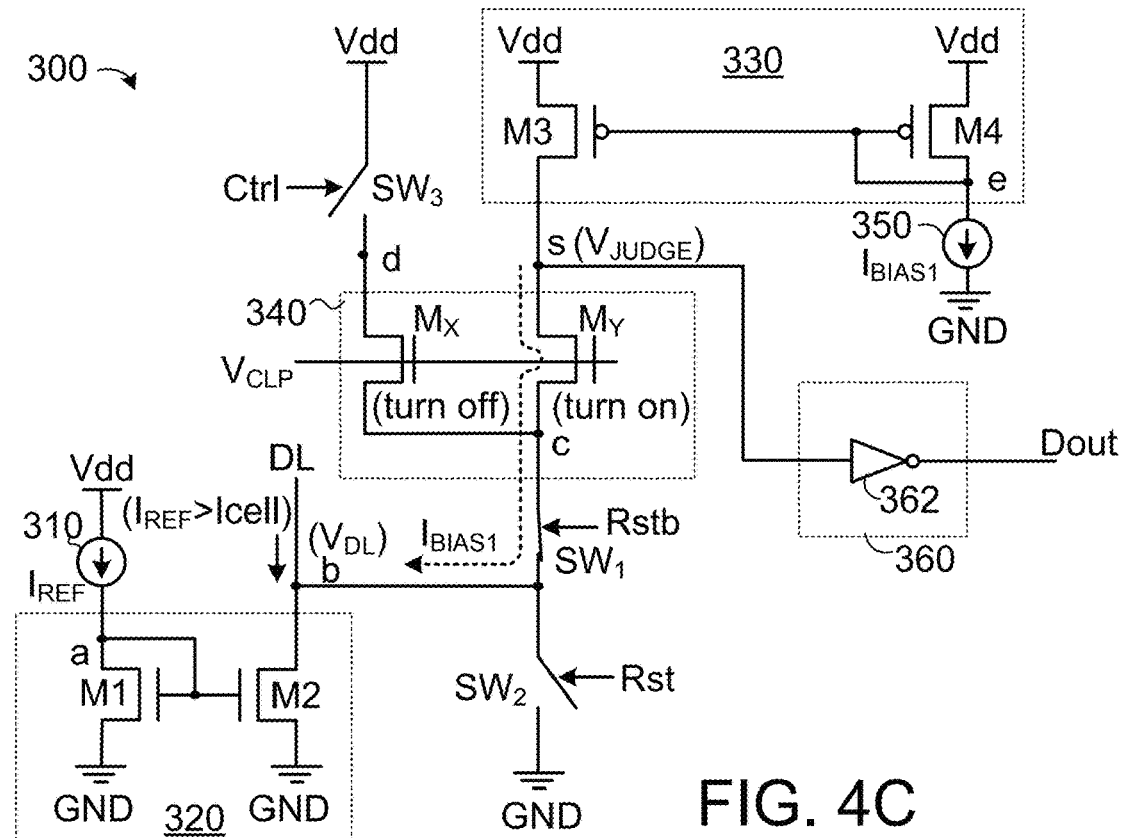

Please refer to FIGS. 4C and 4E. In the time interval between the time point tc and the time point tf (i.e., the sense phase $P_3$ of the sense cycle), the switch $SW_1$ is maintained in the closed state, the switch $SW_2$ is maintained in the opened state, and the switch $SW_3$ is in the opened state. Meanwhile, the voltage control device $M_X$ is turned off. The data line voltage $V_{DL}$ of the data line DL (i.e., the voltage at the node b) and the voltage at the node c are changed according to the magnitude of the cell current Icell.

In the embodiment of FIG. 4E that the storing state of the memory cell is the off state in the sense phase $P_3$ of the sense cycle, the magnitude of the cell current Icell in the data line DL is very low or nearly zero (Icell=0), and the reference current $I_{REF}$ is higher than the cell current Icell (i.e., $I_{REF}$>Icell). Consequently, after the switch $SW_3$ is switched to the opened state (i.e., after the time point tc), the voltage $V_{DL}$ at the node b decreases and the gate-source voltage of the voltage control device $M_Y$ increases. When the gate-source voltage of the voltage control device $M_Y$ rises to the threshold voltage of the voltage control device $M_Y$, the voltage control device $M_Y$ is turned on. The current $I_{BIAS1}$ flows from the mirroring terminal of the current mirror 330 to the mirroring terminal of the current mirror 320 through the voltage control device $M_Y$.

Since the current $I_{BIAS1}$ flows through the voltage control device $M_Y$, the voltage control device $M_Y$ is operated in the saturation region and formed a common-gate amplifier. In addition, the data line voltage $V_{DL}$ of the data line DL (i.e., the voltage at the node b) and the voltage at the node c decrease. Under this circumstance, the judging voltage $V_{JUDGE}$ at the judging node s decreases. Please refer to FIG. 4E. At the time point td, the judging voltage $V_{JUDGE}$ at the judging node s is lower than the transition voltage $V_Q$ of the judging circuit 360. Consequently, the logic level of the output data Dout is switched to a first logic level (e.g., a high logic level "Hi") from a second logic level (e.g., a low logic level "Lo"). At the end of the sense cycle (i.e., at the time point tf), the judging circuit 360 generates the output data Dout at the first logic level (e.g., the high logic level "Hi") to indicate that the memory cell is in the off state.

In case that the storing state of the memory cell connected with the data line DL is the on state, the operations of the sensing apparatus 300 can be shown in FIGS. 4A, 4B, 4D and 4F. In the reset phase $P_1$ (i.e., the situation of FIG. 4A) and the voltage control phase $P_2$ (i.e., the situation of FIG. 4B), the waveforms of the signals shown in FIG. 4F are identical to the waveforms of the signals shown in FIG. 4E, and the operations of the sensing apparatus 300 in the reset phase $P_1$ and the voltage control phase $P_2$ in FIGS. 4F and 4E are similar.

Please refer to FIGS. 4D and 4F. In the time interval between the time point tc and the time point tf (i.e., the sense phase $P_3$ of the sense cycle), the switch $SW_1$ is maintained in the closed state, the switch $SW_2$ is maintained in the opened state, and the switch $SW_3$ is in the opened state. Meanwhile, the voltage control device $M_X$ is turned off. The data line voltage $V_{DL}$ of the data line DL (i.e., the voltage at the node b) and the voltage at the node c are changed according to the magnitude of the cell current Icell.

In the case of FIGS. 4D and 4F that the storing state of the memory cell is the on state in the sense phase $P_3$ of the sense cycle, magnitude of the reference current $I_{REF}$ is lower than magnitude of the cell current Icell in the data line DL (i.e., $I_{REF}$<Icell).

Consequently, after the switch $SW_3$ is switched to the opened state (i.e., after the time point tc), the voltage $V_{DL}$ at the node b rises and the gate-source voltage of the voltage control device $M_Y$ decreases. Consequently, the voltage control device $M_Y$ is continuously turned off, and the voltage at the judging node s is maintained at the supply voltage Vdd. Since the judging voltage $V_{JUDGE}$ at the judging node s is higher than the transition voltage $V_Q$ of the judging circuit 360, the judging circuit 360 generates the output data Dout at the second logic level (e.g., the low logic level "Lo"). At the end of the sense cycle (i.e., at the time point tf), the judging circuit 360 generates the output data Dout at the second logic level (e.g., the low logic level "Lo") to indicate that the memory cell is in the on state. Accordingly, in the sensing phase $P_3$ of the sense cycle, the voltage control circuit 340 is designed to conduct a current in a one-way direction from the judging node s to the node c, according to the magnitude relationship between the reference current $I_{REF}$ and the cell current Icell. When the cell current Icell in the data line DL is lower than the reference current $I_{REF}$ in the sensing phase $P_3$ of the sense cycle, the voltage control circuit 340 conducts the current in the one-way direction from the judging node s to the node c. When the cell current Icell in the data line DL is higher than the reference current $I_{REF}$ in the sensing phase $P_3$ of the sense cycle, the voltage control circuit 340 electrically isolates the judging node s from the node c.

In the sensing apparatus 300, the judging voltage $V_{JUDGE}$ at the judging node s may be not in a full voltage swing signal if $(I_{REF}-Icell) \approx I_{BIAS1}$. That is, the judging voltage $V_{JUDGE}$ may be not switched between the supply voltage Vdd and the ground voltage GND. Under this circumstance, the NOT gate 362 in the judging circuit 360 possibly generates a leakage current. Consequently, additional power consumption is generated.

Figure 5:
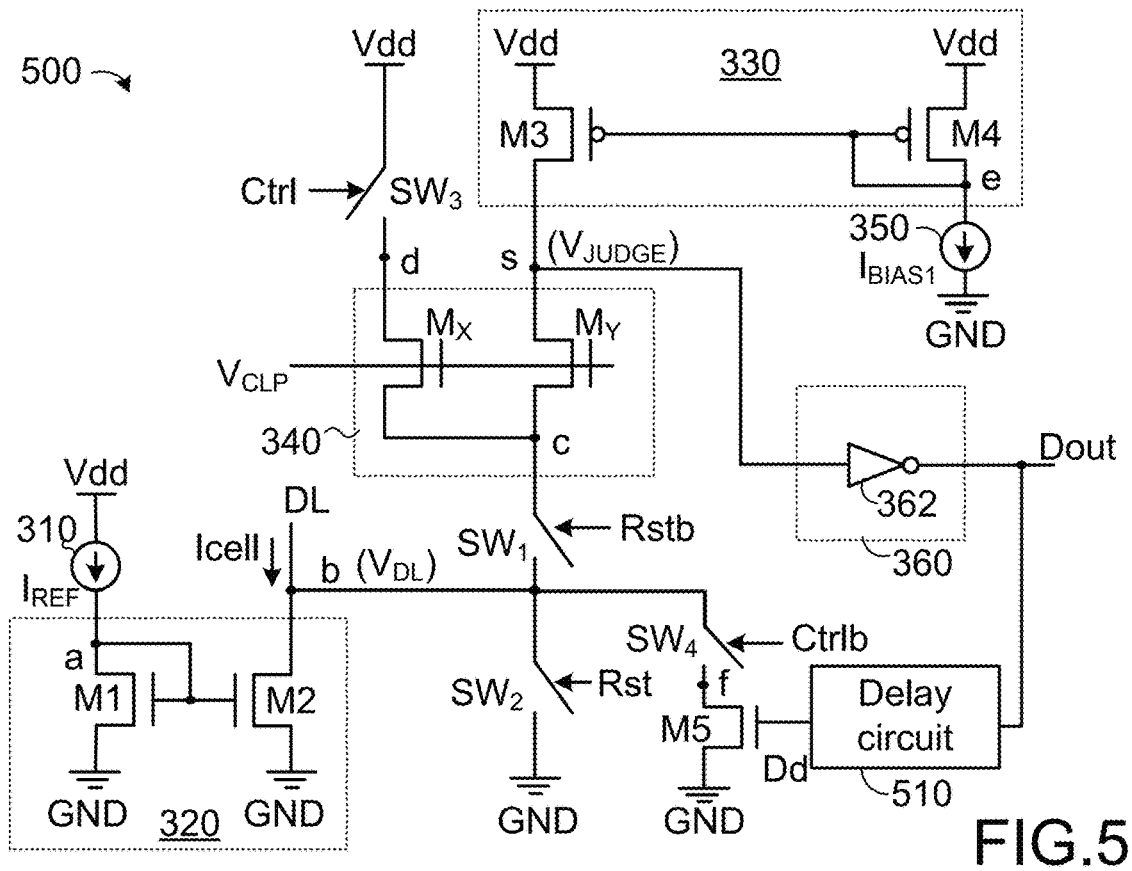
FIG. 5 is a schematic circuit diagram illustrating a sensing apparatus according to a second embodiment of the present invention.

FIG. 5 is a schematic circuit diagram illustrating a sensing apparatus 500 according to a second embodiment of the present invention. In comparison with the sensing apparatus 300 of FIG. 3, the sensing apparatus 500 of the second embodiment further comprises a switch $SW_4$, a transistor M5 and a delay circuit 510. For brevity, only the relationships between the switch $SW_4$, the transistor M5 and the delay circuit 510 will be described as follows. In some embodiments, the delay circuit 510 may be implemented by using the Schmitt trigger or a plurality of buffers connected in series.

The first terminal of the switch $SW_4$ is connected with the node b. The second terminal of the switch $SW_4$ is connected with the node f. The control terminal of the switch $SW_4$ receives an inverted control signal Ctrlb. The control signal Crtl and the inverted control signal Ctrlb are complementary to each other.

The input terminal of the delay circuit 510 is connected with the output terminal of the judging circuit 360 to receive the output data Dout. After the output data Dout is delayed for a specified delay time by the delay circuit 510, a delayed signal Dd is outputted from the output terminal of the delay circuit 510. For example, the specified delay time by the delay circuit 510 is approximately 2 ns.

The drain terminal of the transistor M5 is connected with the node f. The source terminal of the transistor M5 is connected with the ground terminal to receive the ground voltage GND. The gate terminal of the transistor M5 is connected with the output terminal of the delay circuit 510 to receive the delayed signal Dd. In fact, the transistor M5 may be regarded as a pull-down device. When the delayed signal Dd is activated, the pull-down device is enabled.

In this embodiment, the sensing apparatus 500 is additionally equipped with the switch $SW_4$, the transistor M5 and the delay circuit 510. Due to the switch $SW_4$, the transistor M5 and the delay circuit 510, the judging voltage $V_{JUDGE}$ is correspondingly controlled. Consequently, the judging voltage $V_{JUDGE}$ is the full voltage swing signal. In some embodiments, the delay circuit 510 may be omitted. That is, the gate terminal transistor M5 receives the output data Dout when the sensing apparatus 500 is not equipped the delay circuit 510.

The operations of the sensing apparatus 500 in the reset phase $P_1$ and the voltage control phase $P_2$ are similar to those of the sensing apparatus 300 in the first embodiment, and not redundantly described herein. For brevity, only the operations of the sensing apparatus 500 in the sense phase $P_3$ will be described as follows.

Figure 6A:
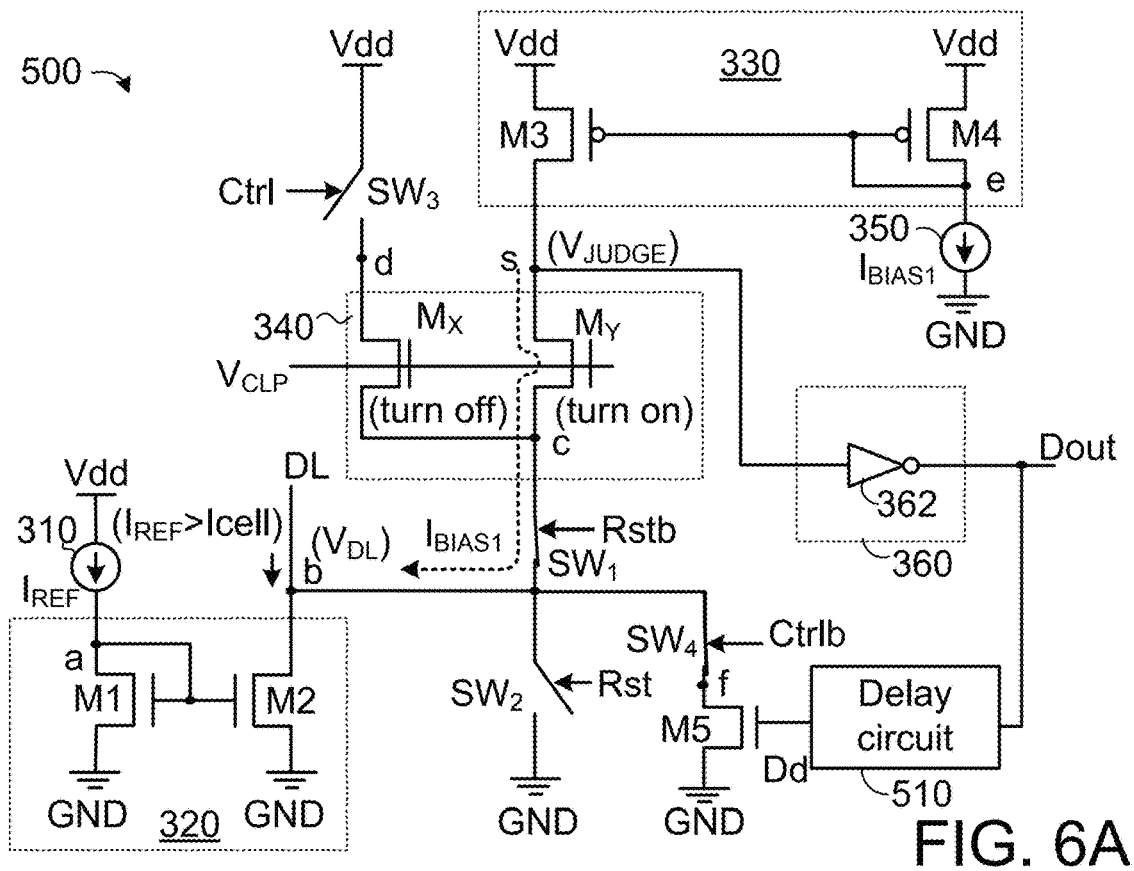
FIGS. 6A and 6B are schematic circuit diagrams illustrating the operations of the sensing apparatus according to the second embodiment of the present invention during the sense cycle.
Figure 6B:
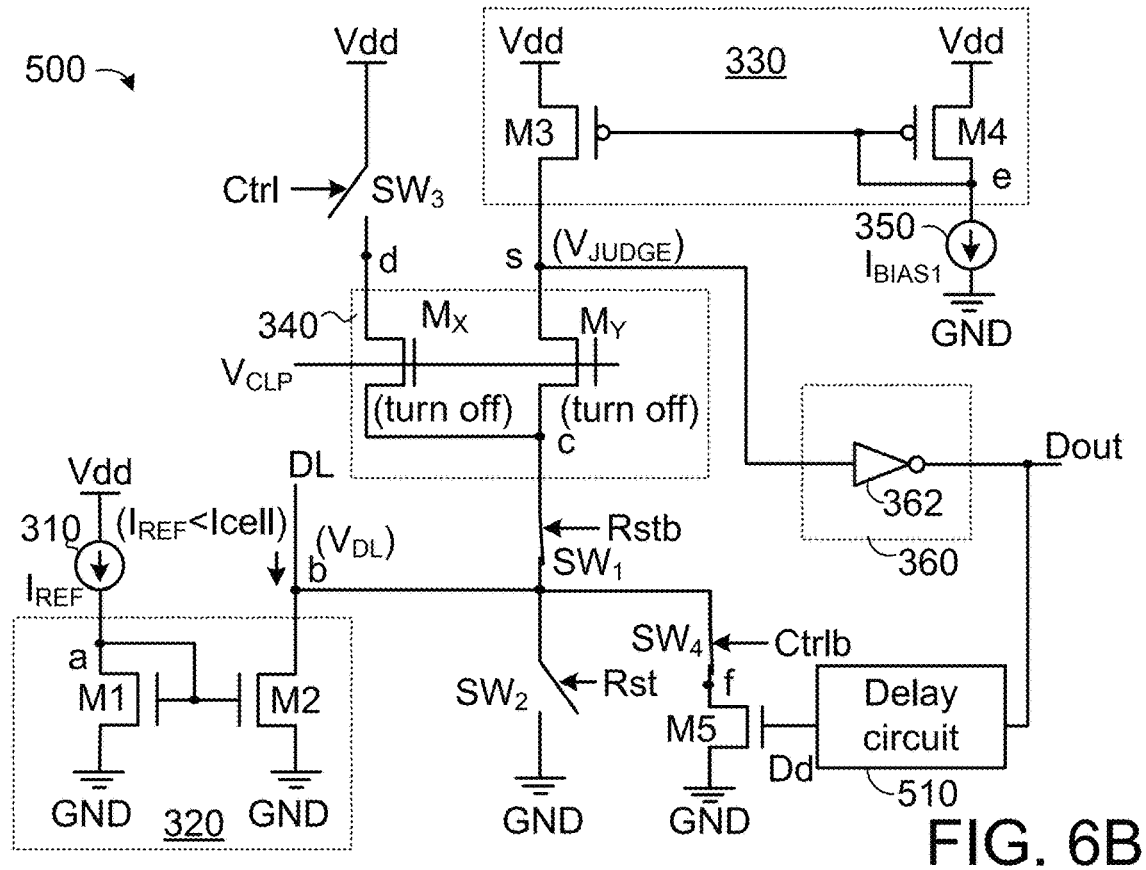
Figure 6C:
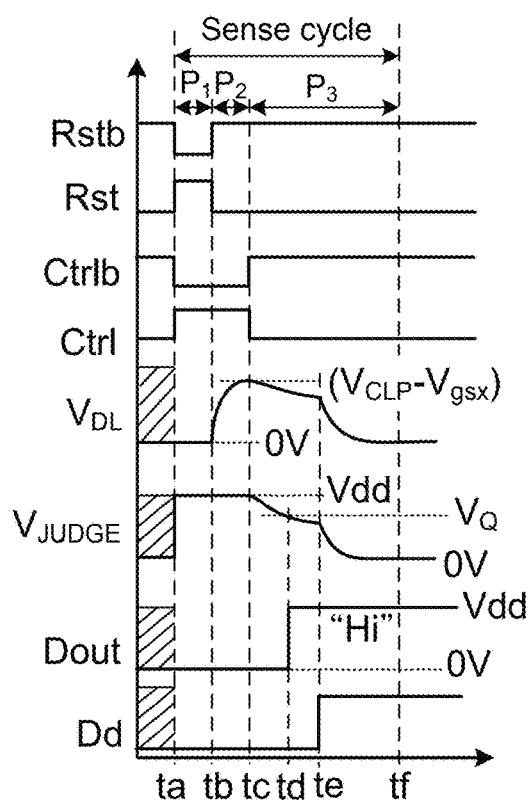
FIGS. 6C and 6D are schematic timing waveform diagrams illustrating associated signals of the sensing apparatus during the sense cycle.
Figure 6D:
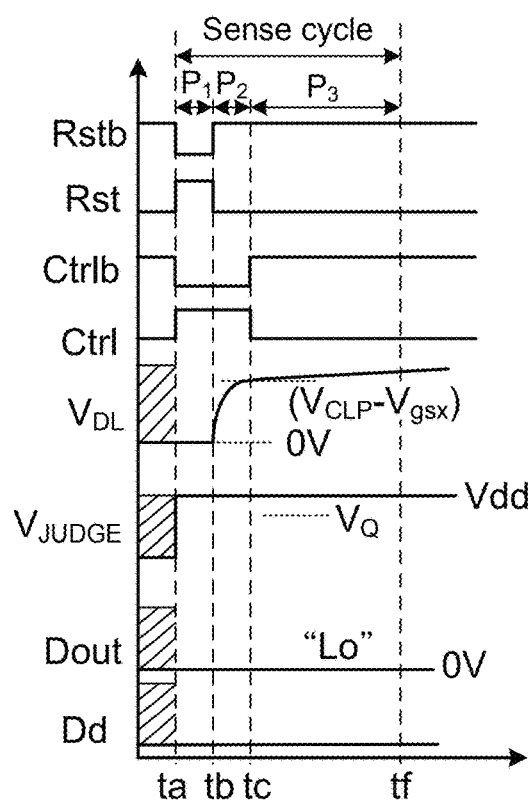

FIGS. 6A and 6B are schematic circuit diagrams illustrating the operations of the sensing apparatus 500 according to the second embodiment of the present invention during the sense cycle. FIGS. 6C and 6D are schematic timing waveform diagrams illustrating associated signals of the sensing apparatus 500 during the sense cycle.

In case that the storing state of the memory cell connected with the data line DL is the off state, the operations of the sensing apparatus 500 in the sense phase $P_3$ can be shown in FIGS. 6A and 6C. In the time interval between the time point tc and the time point tf (i.e., the sense phase $P_3$ of the sense cycle), the switch $SW_1$ is maintained in the closed state, the switch $SW_2$ is maintained in the opened state, the switch $SW_3$ is in the opened state, and the switch $SW_4$ is in the closed state. Meanwhile, the voltage control device $M_X$ is turned off. The data line voltage $V_{DL}$ of the data line DL (i.e., the voltage at the node b) and the voltage at the node c are changed according to the magnitude of the cell current Icell.

Since the storing state of the memory cell is in the off state, the magnitude of the cell current Icell in the data line DL is very low or nearly zero (Icell=0), and the reference current $I_{REF}$ is higher than the cell current Icell (i.e., $I_{REF}$>Icell). Consequently, after the switch $SW_3$ is switched to the opened state (i.e., after the time point tc), the voltage $V_{DL}$ at the node b decreases. The voltage control device $M_Y$ is turned on. The current $I_{BIAS1}$ flows from the mirroring terminal of the current mirror 330 to the mirroring terminal of the current mirror 320 through the voltage control device $M_Y$.

When the current $I_{BIAS1}$ flows through the voltage control device $M_Y$, the voltage control device $M_Y$ is operated in the saturation region and formed a common-gate amplifier. In addition, the data line voltage $V_{DL}$ of the data line DL (i.e., the voltage at the node b) and the voltage at the node c decrease. Under this circumstance, the judging voltage $V_{JUDGE}$ at the judging node s decreases. Please refer to FIG. 6C. At the time point td, the judging voltage $V_{JUDGE}$ at the judging node s is lower than the transition voltage $V_Q$ of the judging circuit 360. Consequently, the logic level of the output data Dout is switched to a first logic level (e.g., a high logic level "Hi").

At the time point te (i.e., after the time point td is delayed for the specified delay time), the delayed signal Dd is activated by the delay circuit 510 and switched to the high logic level. Consequently, the transistor M5 is turned on, and the voltage $V_{DL}$ at the node b is pulled down to the ground voltage GND, causing the voltage control device $M_Y$ entering the linear region and therefore pulling the judging voltage $V_{JUDGE}$ at the judging node s also to the ground voltage GND. That is, when the delayed signal Dd is activated, the pull-down device is enabled. Consequently, the voltage $V_{DL}$ at the node b and the judging voltage $V_{JUDGE}$ at the judging node s are both pulled down to the ground voltage GND. At the end of the sense cycle (i.e., at the time point tf), the judging circuit 360 generates the output data Dout at the first logic level (e.g., the high logic level "Hi") to indicate that the memory cell is in the off state.

In case that the storing state of the memory cell connected with the data line DL is the on state, the operations of the sensing apparatus 500 in the sense phase $P_3$ can be shown in FIGS. 6B and 6D. In the time interval between the time point tc and the time point tf (i.e., the sense phase $P_3$ of the sense cycle), the switch $SW_1$ is maintained in the closed state, the switch $SW_2$ is maintained in the opened state, the switch $SW_3$ is in the opened state, and the switch $SW_4$ is in the closed state. Meanwhile, the voltage control device $M_X$ is turned off. The data line voltage $V_{DL}$ of the data line DL (i.e., the voltage at the node b) and the voltage at the node c are changed according to the magnitude of the cell current Icell.

In the case of FIGS. 6B and 6D that the storing state of the memory cell is the on state in the sense phase $P_3$ of the sense cycle, magnitude of the reference current $I_{REF}$ is lower than magnitude of the cell current Icell in the data line DL (i.e., $I_{REF}$<Icell). Consequently, after the switch $SW_3$ is switched to the opened state (i.e., after the time point tc), the voltage $V_{DL}$ at the node b rises. Consequently, the voltage control device $M_Y$ is continuously turned off, and the voltage at the judging node s is maintained at the supply voltage Vdd.

Since the judging voltage $V_{JUDGE}$ at the judging node s is higher than the transition voltage $V_Q$ of the judging circuit 360, the judging circuit 360 generates the output data Dout at the second logic level (e.g., the low logic level "Lo"). Moreover, the delayed signal Dd is not activated by the delay circuit 510, and the delayed signal Dd is maintained in the low logic level. Consequently, the transistor M5 is turned off (i.e., the pull-down device is disabled). Please refer to FIG. 6D. At the end of the sense cycle (i.e., at the time point tf), the judging circuit 360 generates the output data Dout at the second logic level (e.g., the low logic level "Lo") to indicate that the memory cell is in the on state.

Obviously, in the sensing apparatus 500 of the second embodiment, the judging voltage $V_{JUDGE}$ at the judging node s is the full voltage swing signal. That is, the judging voltage $V_{JUDGE}$ is able to be switched between the supply voltage Vdd and the ground voltage GND.

In each of the sensing apparatuses 300 and 500 of the first and second embodiments, the judging circuit 360 is implemented with the NOT gate 362. It is noted that the constituents of the judging circuit 360 are not restricted.

For example, in some embodiments, the judging circuit 360 may be implemented with the comparator 232 of the judging circuit 230 shown in FIG. 2. In this case, the comparator 232 is connected with the judging node s through the inverting input terminal of the comparator 232 to receive the judging voltage $V_{JUDGE}$. The positive input terminal of the comparator 232 receives a comparison circuit $V_{CMP}$. The output terminal of the comparator 232 generates the output data Dout. The comparison voltage $V_{CMP}$ is identical to the transition voltage $V_Q$ shown in FIGS. 4E and 4F. Consequently, in case that the memory cell is in the off state, the comparator 232 provides the output data Dout at the first logic level (e.g., the high logic level "Hi"). In case that the memory cell is in the on state, the comparator provides the output data Dout at the second logic level (e.g., the low logic level "Lo").

Generally, during the program cycle of the non-volatile memory, the sensing apparatus is disabled. During the sense cycle of the non-volatile memory, the sensing apparatus is enabled. In some embodiment, the sensing apparatus of the non-volatile memory receives an enable signal. When the enable signal is activated, it means that the sense cycle starts. That is, the sensing apparatus is operated according to the enable signal.

Figure 7:
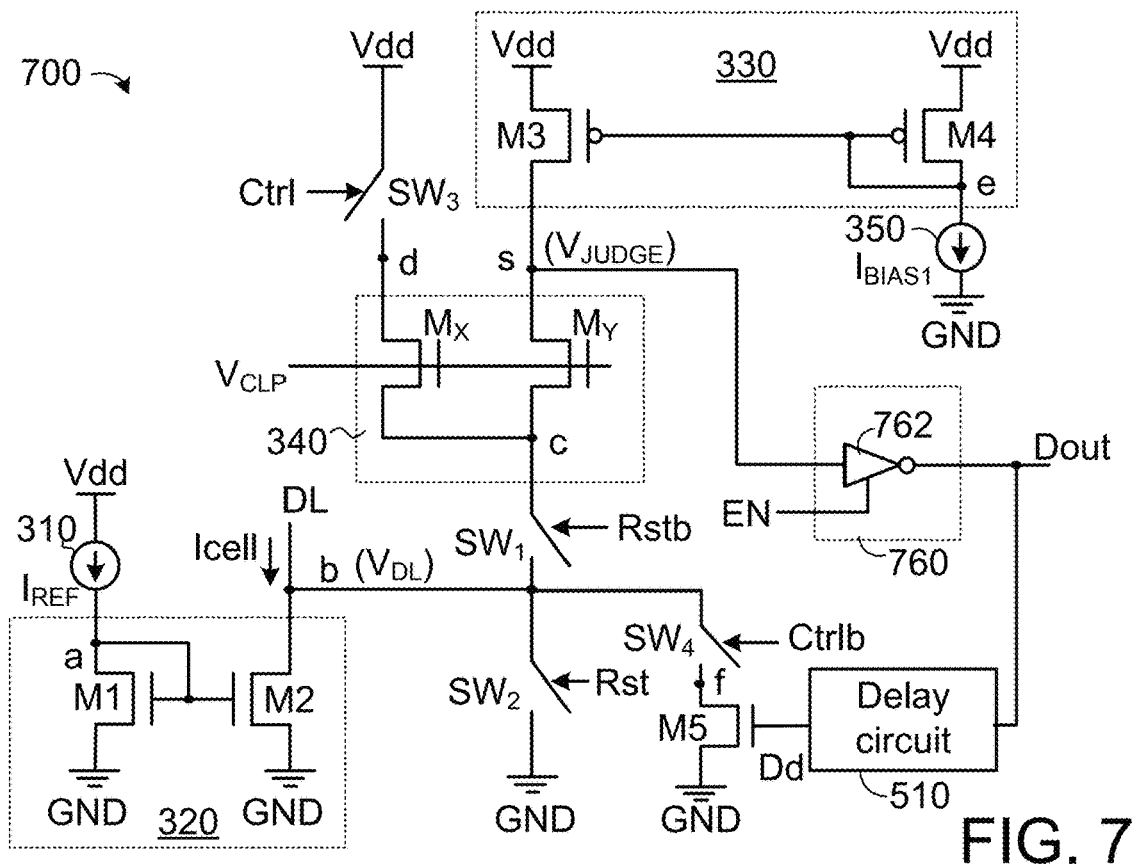
FIG. 7 is a schematic circuit diagram illustrating a sensing apparatus according to a third embodiment of the present invention.

FIG. 7 is a schematic circuit diagram illustrating a sensing apparatus 700 according to a third embodiment of the present invention. In comparison with the sensing apparatus 500 of the second embodiment, the judging circuit 760 of the sensing apparatus 700 in the third embodiment receives an enable signal EN. For example, in the judging circuit 760, the input terminal of the NOT gate 762 is connected with the judging node s, the output terminal of the NOT gate 762 generates the output data Dout, and the enable terminal of the NOT gate 762 receives the enable signal EN.

In case that the enable signal EN is not activated, the sense cycle does not start, and the sensing apparatus 700 is disabled. In case that the enable signal EN is activated, the sense cycle starts, and the sensing apparatus 700 is enabled. For example, the enable signal EN in the high logic level state indicates that the sense cycle starts. In the time period corresponding to the high logic level state of the enable signal EN, the sensing apparatus 700 judges the storing states of plural memory cells in plural sense cycles. The operations of the sensing apparatus 700 in the third embodiment are similar to the operations of the sensing apparatus 500 in the second embodiment, and not redundantly described herein.

In a variant example, the judging circuit 760 in the sensing apparatus 700 of the third embodiment is implemented with another circuit (e.g., the comparator 232) in manners similar to the descriptions above regarding the judging circuit 360.

Figure 8:
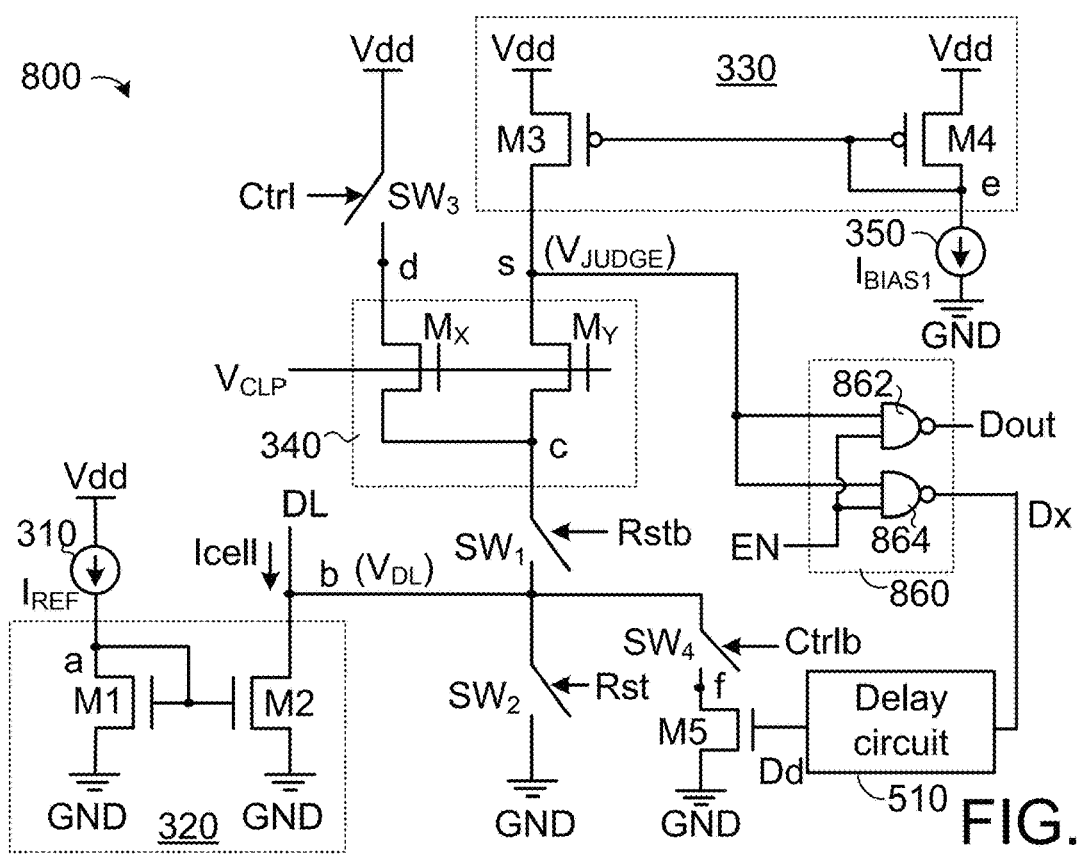
FIG. 8 is a schematic circuit diagram illustrating a sensing apparatus according to a fourth embodiment of the present invention.

FIG. 8 is a schematic circuit diagram illustrating a sensing apparatus 800 according to a fourth embodiment of the present invention. In comparison with the sensing apparatus 700 of the third embodiment, the circuitry structure of the judging circuit 860 in the sensing apparatus 800 of the fourth embodiment is distinguished. For brevity, only the connecting relationship between the judging circuit 860 and associated components will be described as follows.

The judging circuit 860 comprises two NAND gates 862 and 864. The first input terminal of the NAND gate 862 is connected with the judging node s. The second input terminal of the NAND gate 862 receives the enable signal EN. The output terminal of the NAND gate 862 generates the output data Dout. The first input terminal of the NAND gate 864 is connected with the judging node s. The second input terminal of the NAND gate 864 receives the enable signal EN. The output terminal of the NAND gate 864 generates a notification signal Dx. The input terminal of the delay circuit 510 receives the notification signal Dx, and the output terminal of the delay circuit 510 generates the delayed signal Dd. In an embodiment, the two NAND gates 862 and 864 have different transition voltages. The transition voltage $V_{Q1}$ of the NAND gate 862 and the transition $V_{Q2}$ of the NAND gate 864 are different, wherein $V_{Q1}$>$V_{Q2}$.

In the sense cycle, the enable signal EN has a first logic level (e.g., a high logic level). The operations of the sensing apparatus 800 in the reset phase $P_1$ and the voltage control phase $P_2$ are similar to those of the sensing apparatus 300 in the first embodiment, and not redundantly described herein. For brevity, only the operations of the sensing apparatus 800 in the sense phase $P_3$ will be described as follows.

Figure 9A:
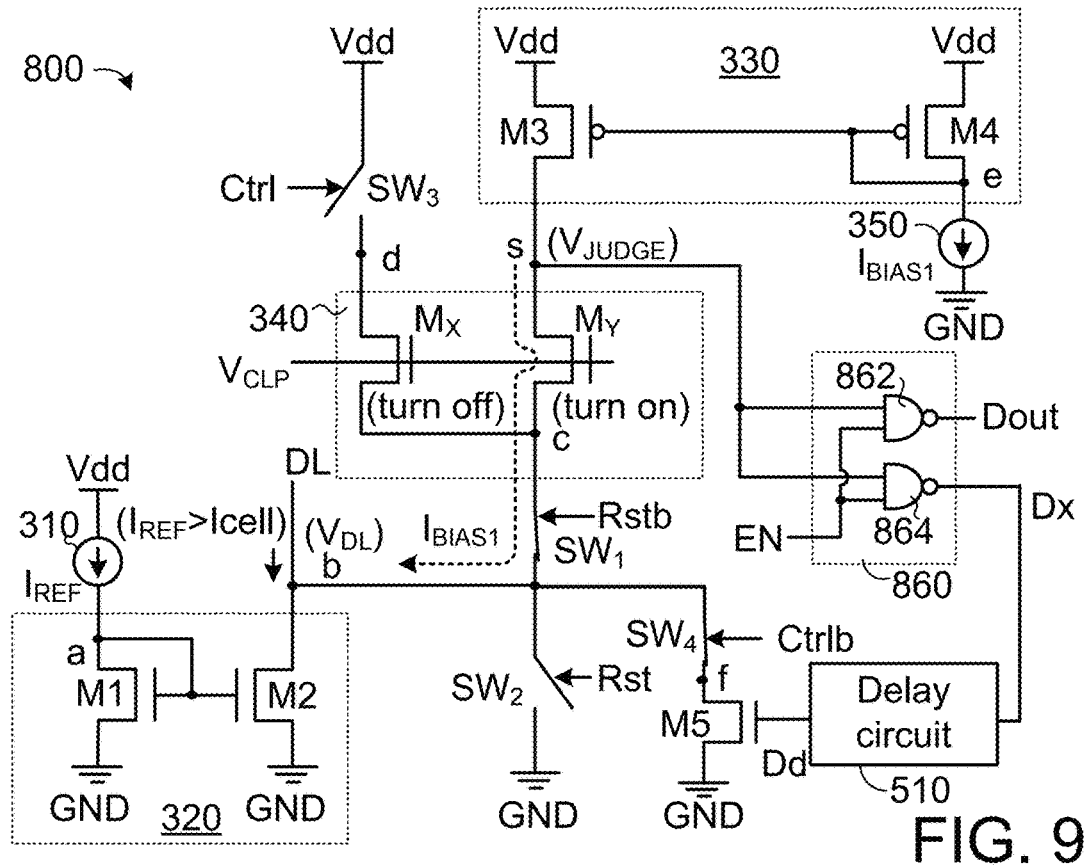
FIGS. 9A and 9B are schematic circuit diagrams illustrating the operations of the sensing apparatus according to the fourth embodiment of the present invention during the sense cycle.
Figure 9B:
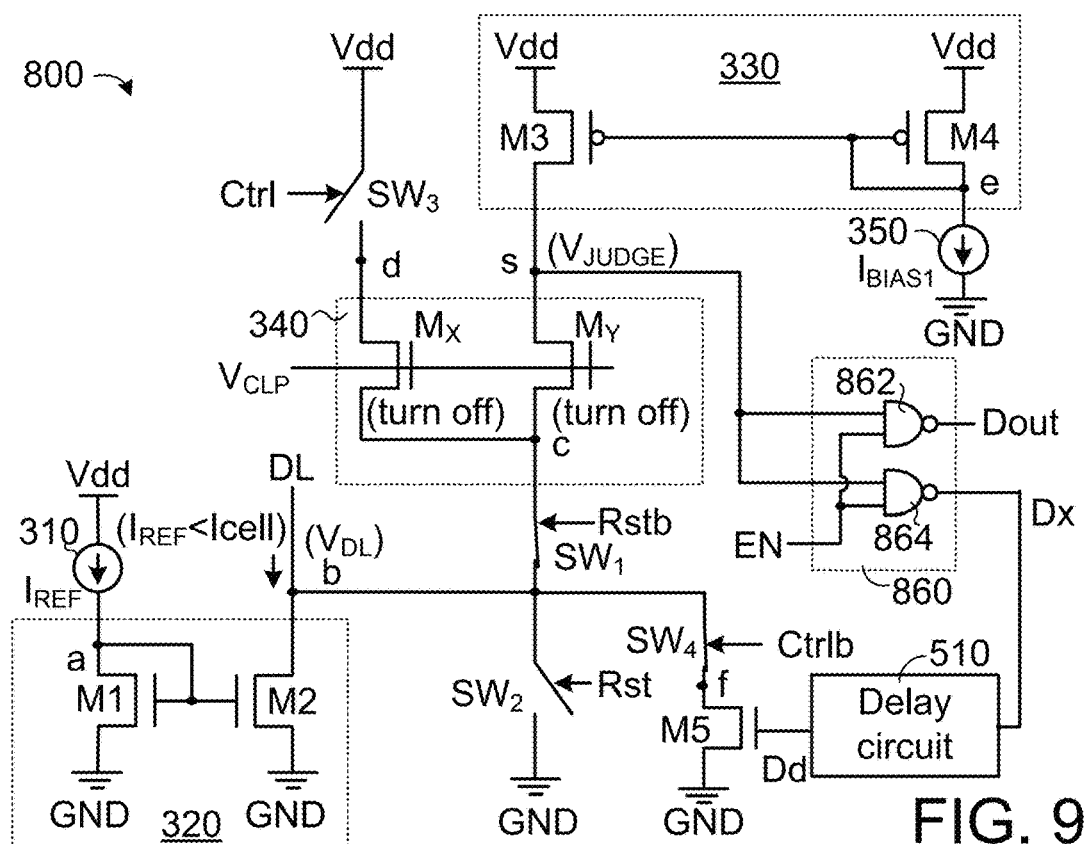
Figure 9C:
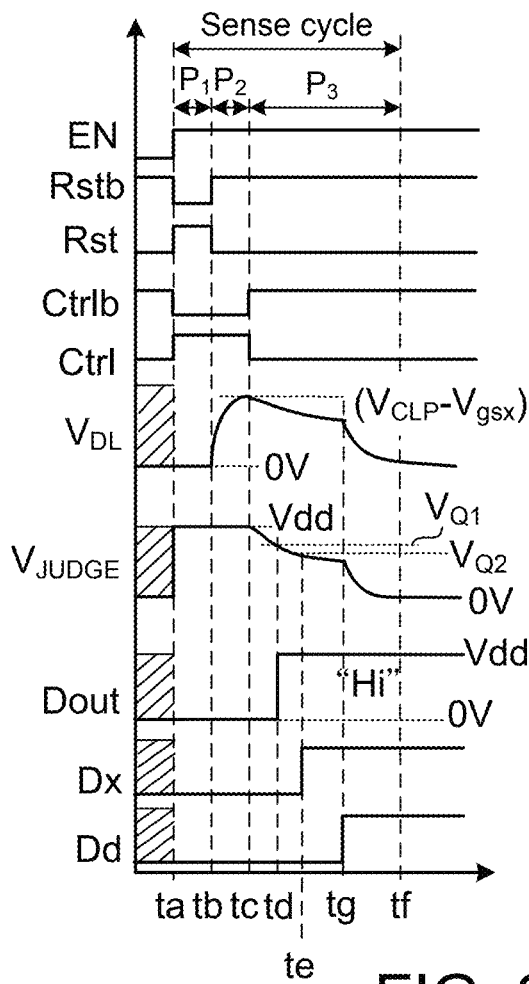
FIGS. 9C and 9D are schematic timing waveform diagrams illustrating associated signals of the sensing apparatus during the sense cycle.
Figure 9D:
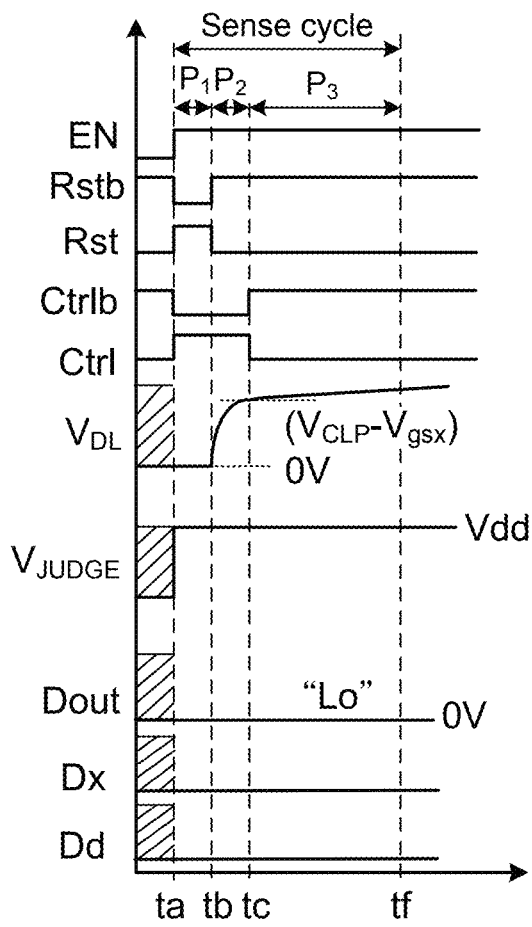

FIGS. 9A and 9B are schematic circuit diagrams illustrating the operations of the sensing apparatus 800 according to the fourth embodiment of the present invention during the sense cycle. FIGS. 9C and 9D are schematic timing waveform diagrams illustrating associated signals of the sensing apparatus 800 during the sense cycle.

In case that the storing state of the memory cell connected with the data line DL is the off state, the operations of the sensing apparatus 800 in the sense phase $P_3$ can be shown in FIGS. 9A and 9C. In the time interval between the time point tc and the time point tf (i.e., the sense phase $P_3$ of the sense cycle), the switch $SW_1$ is maintained in the closed state, the switch $SW_2$ is maintained in the opened state, the switch $SW_3$ is in the opened state, and the switch $SW_4$ is in the closed state. Meanwhile, the voltage control device $M_X$ is turned off. The data line voltage $V_{DL}$ of the data line DL (i.e., the voltage at the node b) and the voltage at the node c are changed according to the magnitude of the cell current Icell.

Since the storing state of the memory cell is in the off state, the magnitude of the cell current Icell in the data line DL is very low or nearly zero (Icell=0), and the reference current $I_{REF}$ is higher than the cell current Icell (i.e., $I_{REF}$>Icell). Consequently, after the switch $SW_3$ is switched to the opened state (i.e., after the time point tc), the voltage $V_{DL}$ at the node b decreases. The voltage control device $M_Y$ is turned on. The current $I_{BIAS1}$ flows from the mirroring terminal of the current mirror 330 to the mirroring terminal of the current mirror 320 through the voltage control device $M_Y$.

When the current $I_{BIAS1}$ flows through the voltage control device $M_Y$, the voltage control device $M_Y$ is operated in the saturation region and forms a common-gate amplifier. In addition, the data line voltage $V_{DL}$ of the data line DL (i.e., the voltage at the node b) and the voltage at the node c decrease. Under this circumstance, the judging voltage $V_{JUDGE}$ at the judging node s decreases. Please refer to FIG. 9C. At the time point td, the judging voltage $V_{JUDGE}$ at the judging node s is lower than the transition voltage $V_{Q1}$ of the NAND gate 862 in the judging circuit 860. Consequently, the logic level of the output data Dout is switched to the first logic level (e.g., the high logic level "Hi") from the second logic level (e.g., the low logic level "Lo") by the judging circuit 860.

At the time point te, the judging voltage $V_{JUDGE}$ at the judging node s is lower than the transition voltage $V_{Q2}$ of the NAND gate 864. Consequently, the notification signal Dx is switched to the first logic level (e.g., the high logic level "Hi") from the second logic level (e.g., the low logic level "Lo") by the judging circuit 860. Moreover, at the time point tg (i.e., after the time point te is delayed for the specified delay time), the delayed signal Dd is activated by the delay circuit 510 and switched to the high logic level. Consequently, the transistor M5 is turned on, and the voltage $V_{DL}$ at the node b and the judging voltage $V_{JUDGE}$ at the judging node s are both pulled down to the ground voltage GND. That is, when the delayed signal Dd is activated, the pull-down device is enabled. Consequently, the voltage $V_{DL}$ at the node b and the judging voltage $V_{JUDGE}$ at the judging node s are both pulled down to the ground voltage GND. At the end of the sense cycle (i.e., at the time point tf), the judging circuit 860 issues the output data Dout with the first logic level (e.g., the high logic level "Hi") to indicate that the memory cell is in the off state.

In case that the storing state of the memory cell connected with the data line DL is the on state, the operations of the sensing apparatus 800 in the sense phase $P_3$ can be shown in FIGS. 9B and 9D. In the time interval between the time point tc and the time point tf (i.e., the sense phase $P_3$ of the sense cycle), the switch $SW_1$ is maintained in the closed state, the switch $SW_2$ is maintained in the opened state, the switch $SW_3$ is in the opened state, and the switch $SW_4$ is in the closed state. Meanwhile, the voltage control device $M_X$ is turned off. The data line voltage $V_{DL}$ of the data line DL (i.e., the voltage at the node b) and the voltage at the node c are changed according to the magnitude of the cell current Icell.

In the sense phase $P_3$ of the sense cycle, the storing state of the memory cell is in the on state. Consequently, magnitude of the reference current $I_{REF}$ is lower than magnitude of the cell current Icell in the data line DL (i.e., $I_{REF}$<Icell). Consequently, after the switch $SW_3$ is switched to the opened state (i.e., after the time point tc), the voltage $V_{DL}$ at the node b rises. Consequently, the voltage control device $M_Y$ is continuously turned off, and the voltage at the judging node s is maintained at the supply voltage Vdd.

Since the judging voltage $V_{JUDGE}$ at the judging node s is higher than the transition voltage $V_{Q1}$ of the NAND gate 862 and the transition voltage $V_{Q1}$ of the NAND gate 864, the judging circuit 860 generates the output data Dout at a second logic level (e.g., a low logic level "Lo") and the notification signal Dx. Moreover, the delayed signal Dd is not activated by the delay circuit 510, and the delayed signal Dd is maintained in the low logic level. Consequently, the transistor M5 is turned off, and the pull-down device is disabled. Please refer to FIG. 9D. At the end of the sense cycle (i.e., at the time point tf), the judging circuit 360 generates the output data Dout at the second logic level (e.g., the low logic level "Lo") to indicate that the memory cell is in the on state.

Figure 10A:
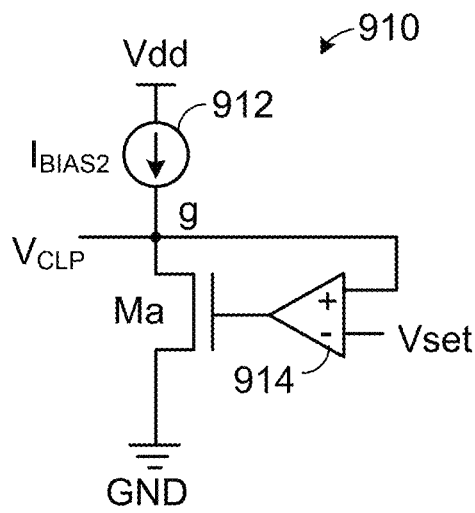
FIG. 10A is a schematic circuit diagram illustrating a first exemplary voltage clamping circuit for the sensing apparatus of the present invention.

FIG. 10A is a schematic circuit diagram illustrating a first exemplary voltage clamping circuit 910 for the sensing apparatus of the present invention. The voltage clamping circuit 910 provides the clamping voltage $V_{CLP}$ to the voltage control circuit 340 in each of the sensing apparatuses 300, 500, 700 and 800 of the above four embodiments. As shown in FIG. 10A, the voltage clamping circuit 910 comprises a current source 912, a transistor Ma and an operational amplifier 914.

The current source 912 is connected between the supply voltage Vdd and the node g. The current source 912 generates a bias current $I_{BIAS2}$. The drain terminal of the transistor Ma is connected with the node g. The gate terminal of the transistor Ma is connected with the output terminal of the operational amplifier 914. The source terminal of the transistor Ma is connected with the ground terminal to receive the ground voltage GND. The first input terminal (e.g., the inverting input terminal) of the operational amplifier 914 receives a set voltage Vset. The second input terminal (e.g., the non-inverting input terminal) of the operational amplifier 914 is connected with the node g. The voltage at the node g is the clamping voltage $V_{CLP}$. Consequently, when the voltage clamping circuit 910 is operated normally, the voltage at the node g is equal to the set voltage Vset. That is, the clamping voltage $V_{CLP}$ outputted from the voltage clamping circuit 910 is equal to the set voltage Vset. For example, if the set voltage Vset is 1V, the clamping voltage $V_{CLP}$ received by the voltage control circuit 340 is also 1V.

Figure 10B:
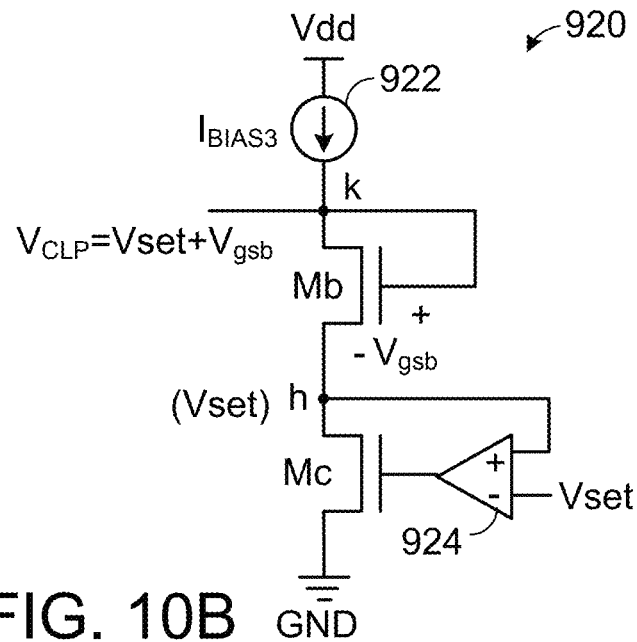
FIG. 10B is a schematic circuit diagram illustrating a second exemplary voltage clamping circuit for the sensing apparatus of the present invention.

FIG. 10B is a schematic circuit diagram illustrating a second exemplary voltage clamping circuit 920 for the sensing apparatus of the present invention. Similarly, the voltage clamping circuit 920 provides the clamping voltage $V_{CLP}$ to the voltage control circuit 340 in each of the sensing apparatuses 300, 500, 700 and 800 of the above four embodiments. As shown in FIG. 10B, the voltage clamping circuit 920 comprises a current source 922, a transistor Mb, a transistor Mc and an operational amplifier 924.

The current source 922 is connected between the supply voltage Vdd and the node k. The current source 922 generates a bias current $I_{BIAS3}$. The source terminal of the transistor Mb is connected with the node h. The drain terminal of the transistor Mb is connected with the node k. The gate terminal of the transistor Mb is connected with the node k. The voltage at the node k is the clamping voltage $V_{CLP}$. In other words, the transistor Mb is a diode-connected transistor. The drain terminal of the transistor Mc is connected with the node h. The gate terminal of the transistor Mc is connected with the output terminal of the operational amplifier 924. The source terminal of the transistor Mc receives the ground voltage GND. The first input terminal (e.g., the inverting input terminal) of the operational amplifier 924 receives a set voltage Vset. The second input terminal (e.g., the non-inverting input terminal) of the operational amplifier 924 is connected with the node h. Consequently, when the voltage clamping circuit 920 is operated normally, the voltage at the node h is the set voltage Vset. The voltage at the gate terminal of the transistor Mb (i.e., the voltage at the node k) is equal to the set voltage Vset plus the gate-source voltage $V_{gsb}$ of the transistor Mb. That is, the clamping voltage $V_{CLP}$ outputted from the voltage clamping circuit 920 is equal to the set voltage Vset plus the gate-source voltage $V_{gsb}$ (i.e., $V_{CLP}$=Vset+$V_{gsb}$).

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A sensing apparatus for a non-volatile memory, wherein the non-volatile memory comprises a memory cell, the memory cell is coupled with a data line during a sense cycle, the sensing apparatus comprising:
   a first current mirror, wherein an input terminal of the first current mirror is connected with the first node to receive a reference current, a mirroring terminal of the first current mirror is connected with a second node, and the second node is connected with the data line;
   a first switch, wherein a first terminal of the first switch is connected with the second node, a second terminal of the first switch is connected with a third node, and a control terminal of the first switch is configured to receive an inverted reset pulse;
   a second switch, wherein a first terminal of the second switch is connected with the second node, a second terminal of the second switch receives a ground voltage, and a control terminal of the second switch is configured to receive a reset pulse;
   a voltage control circuit receiving a clamping voltage, wherein the voltage control circuit is connected with the third node, a fourth node and a judging node;
   a third switch, wherein a first terminal of the third switch is connected with the fourth node, a second terminal of the third switch receives the supply voltage, and a control terminal of the third switch is configured to receive a control signal;
   a second current mirror, wherein an input terminal of the second current mirror is connected with a fifth node to receive a first bias current, and a mirroring terminal of the second current mirror is connected with the judging node; and
   a judging circuit, wherein an input terminal of the judging circuit is connected with the judging node, and an output terminal of the judging circuit is configured to generate an output data according to a judging voltage at the judging node.

2. The sensing apparatus as claimed in claim 1, wherein the voltage control circuit comprises:
   a first voltage control device, wherein a first terminal of the first voltage control device is connected with the fourth node, a second terminal of the first voltage control device is connected with the third node, and a control terminal of the first voltage control device is configured to receive the clamping voltage; and
   a second voltage control device, wherein a first terminal of the second voltage control device is connected with the judging node, a second terminal of the second voltage control device is connected with the third node, and a control terminal of the second voltage control device is configured to receive the clamping voltage,
   wherein a first threshold voltage of the first voltage control device is lower than a second threshold voltage of the second voltage control device.

3. The sensing apparatus as claimed in claim 2, wherein in a reset phase of the sense cycle, a voltage at the second node is rest to the ground voltage, and the judging voltage at the judging node is the supply voltage.

4. The sensing apparatus as claimed in claim 3, wherein in the reset phase of the sense cycle, the first switch is in an opened state, the second switch is in a closed state, and the third switch is in the closed state.

5. The sensing apparatus as claimed in claim 3, wherein in a voltage control phase of the sense cycle after the reset phase, the first voltage control device in the voltage control circuit is turned on to charge the third node, so that the second voltage control device in the voltage control circuit is turned off and the judging voltage at the judging node is the supply voltage.

6. The sensing apparatus as claimed in claim 5, wherein in the voltage control phase of the sense cycle, the first switch is in a closed state, the second switch is in an opened state, and the third switch is in the closed state.

7. The sensing apparatus as claimed in claim 5, wherein in a sense phase of the sense cycle after the voltage control phase, a voltage at the second node is changed according to a magnitude of a cell current of the memory cell.

8. The sensing apparatus as claimed in claim 7, wherein if the cell current of the memory cell is lower than the reference current in the sense phase of the sense cycle, the second voltage control device in the voltage control circuit is turned on, the judging voltage at the judging node decreases, and the judging circuit generates the output data with a first logic level to indicate that the memory cell is in an off state.

9. The sensing apparatus as claimed in claim 7, wherein if the cell current of the memory cell is higher than the reference current in the sense phase of the sense cycle, the second voltage control device in the voltage control circuit is turned off, the judging voltage at the judging node is the supply voltage, and the judging circuit generates the output data with a second logic level to indicate that the memory cell is in an on state.

10. The sensing apparatus as claimed in claim 7, wherein in the sense phase of the sense cycle, the first switch is in a closed state, the second switch is in an opened state, and the third switch is in the opened state.

11. The sensing apparatus as claimed in claim 2, wherein the first voltage control device comprises a first transistor, and the second voltage control device comprises a second transistor, wherein a drain terminal of the first transistor is connected with the fourth node, a source terminal of the first transistor is connected with the third node, a gate terminal of the first transistor is configured to receive the clamping voltage, a drain terminal of the second transistor is connected with the judging node, a source terminal of the second transistor is connected with the third node, and a gate terminal of the second transistor is configured to receive the clamping voltage, wherein a size of the first transistor is larger than a size of the second transistor, and the first threshold voltage of the first transistor is lower than the second threshold voltage of the second transistor.

12. The sensing apparatus as claimed in claim 2, wherein the first voltage control device comprises J transistors, and the second voltage control device comprises K transistors, wherein drain terminals of the J transistors are connected with the fourth node, source terminals of the J transistors are connected with the third node, gate terminals of the J transistors are configured to receive the clamping voltage, drain terminals of the K transistors are connected with the judging node, source terminals of the K transistors are connected with the third node, and gate terminals of the K transistors are configured to receive the clamping voltage, wherein a size of each of the J transistors and a size of each of the K transistors are identical, and J and K are positive integers.

13. The sensing apparatus as claimed in claim 1, wherein the first current mirror comprises:
  a first transistor, wherein a drain terminal of the first transistor is connected with the first node, a gate terminal of the first transistor is connected with the first node, and a source terminal of the first transistor is configured to receive the ground voltage; and
  a second transistor, wherein a drain terminal of the second transistor is connected with the second node, a gate terminal of the second transistor is connected with the first node, and a source terminal of the second transistor is configured to receive the ground voltage.

14. The sensing apparatus as claimed in claim 1, wherein the second current mirror comprises:
  a first transistor, wherein a drain terminal of the first transistor is connected with the judging node, a gate terminal of the first transistor is connected with the fifth node, and a source terminal of the first transistor is configured to receive the supply voltage; and
  a second transistor, wherein a drain terminal of the second transistor is connected with the fifth node, a gate terminal of the second transistor is connected with the fifth node, and a source terminal of the second transistor is configured to receive the supply voltage.

15. The sensing apparatus as claimed in claim 1, wherein the judging circuit comprises a comparator, wherein a first input terminal of the comparator is connected with the judging node, a second input terminal of the comparator is configured to receive a comparison voltage, and an output terminal of the comparator generates the output data, wherein the comparison voltage is higher than the ground voltage, and the comparison voltage is lower than the supply voltage.

16. The sensing apparatus as claimed in claim 1, wherein the judging circuit comprises a NOT gate, an input terminal of the NOT gate is connected with the judging node, and an output terminal of the NOT gate generates the output data.

17. The sensing apparatus as claimed in claim 1, wherein the sensing apparatus further comprises:
  a fourth switch, wherein a first terminal of the fourth switch is connected with the second node, a second terminal of the fourth switch is connected with a sixth node, and a control terminal of the fourth switch is configured to receive an inverted control signal; and
  a pull-down device connected between the sixth node and a ground terminal, and configured to pull a voltage at the second node to the ground voltage of the ground terminal according to the output data.

18. The sensing apparatus as claimed in claim 17, wherein the sensing apparatus further comprises:
  a delay circuit, wherein an input terminal of the delay circuit is configured to receive the output data, and an output terminal of the delay circuit is configured to generate a delayed signal according to the output data, wherein the pull-down device is connected with the output terminal of the delay circuit to receive the delayed signal,
  wherein when the delayed signal is activated, the voltage at the second node is pulled down to the ground voltage by the pull-down device.

19. The sensing apparatus as claimed in claim 1, wherein the judging circuit is configured to receive an enable signal and configured to generate the output data and a notification signal according to the enable signal and the judging voltage at the judging node, and the sensing apparatus further comprises:
  a fourth switch, wherein a first terminal of the fourth switch is connected with the second node, a second terminal of the fourth switch is connected with a sixth node, and a control terminal of the fourth switch is configured to receive an inverted control signal; and
  a pull-down device connected between the sixth node and a ground terminal, and configured to pull a voltage at the second node to a ground voltage of the ground terminal according to the notification signal.

20. The sensing apparatus as claimed in claim 19, wherein the sensing apparatus further comprises:
  a delay circuit, wherein an input terminal of the delay circuit is configured to receive the notification signal, and an output terminal of the delay circuit is configured to generate a delayed signal according to the notification signal, wherein the pull-down device is connected with the output terminal of the delay circuit to receive the delayed signal,
  wherein when the delayed signal is activated, the voltage at the second node is pulled down to the ground voltage by the pull-down device.

21. The sensing apparatus as claimed in claim 19, wherein the judging circuit comprises:
  a first NAND gate, wherein a first input terminal of the first NAND gate is connected with the judging node, a second input terminal of the first NAND gate is configured to receive the enable signal, and an output terminal of the first NAND gate is configured to generate the output data;
  a second NAND gate, wherein a first input terminal of the second NAND gate is connected with the judging node, a second input terminal of the second NAND gate is configured to receive the enable signal, and an output terminal of the second NAND gate is configured to generate the notification signal; and
  wherein a first transition voltage of the first NAND gate is higher than a second transition voltage of the second NAND gate.

22. The sensing apparatus as claimed in claim 1, wherein the non-volatile memory further comprises a voltage clamping circuit, and the voltage clamping circuit comprises:
  a first current source connected with a sixth node, wherein the first current source is configured to generate a second bias current, and a voltage at the sixth node is the clamping voltage;
  a first transistor, wherein a drain terminal of the first transistor is connected with the sixth node, and a source terminal of the first transistor is configured to receive the ground voltage; and
  an operational amplifier, wherein a first input terminal of the operational amplifier is configured to receive a set voltage, a second input terminal of the operational amplifier is connected with the sixth node, and an output terminal of the operational amplifier is connected with a gate terminal of the first transistor.

23. The sensing apparatus as claimed in claim 1, wherein the non-volatile memory further comprises a voltage clamping circuit, and the voltage clamping circuit comprises:

a first current source connected with a sixth node, wherein the first current source is configured to generate a second bias current, and a voltage at the sixth node is the clamping voltage;

a first transistor, wherein a drain terminal of the first transistor is connected with the sixth node, a gate terminal of the first transistor is connected with the sixth node, and a source terminal of the first transistor is connected with a seventh node;

a second transistor, wherein a drain terminal of the second transistor is connected with the seventh node, and a source terminal of the second transistor is configured to receive the ground voltage; and an operational amplifier, wherein a first input terminal of the operational amplifier is configured to receive a set voltage, a second input terminal of the operational amplifier is connected with the seventh node, and an output terminal of the operational amplifier is connected with a gate terminal of the second transistor.

24. A sensing apparatus for a non-volatile memory, wherein the non-volatile memory comprises a memory cell, the memory cell is coupled with a data line during a sense cycle, the sensing apparatus comprising:

a first current mirror connected with a first node and a second node, and configured to control a first current flowing from the second node according to a reference current flowing through the first node, wherein the second node is connected with the data line;

a first switch connected between the second node and a third node, and a control terminal of the first switch is configured to receive an inverted reset pulse;

a second switch connected between the second node and a ground terminal, and a control terminal of the second switch is configured to receive a reset pulse;

a voltage control circuit connected with the third node and a judging node, and configured to conduct a current in a one-way direction from the judging node to the third node in a sensing phase of the sense cycle according to a magnitude relationship between the reference current and a cell current in the data line;

a second current mirror connected with the judging node and a fourth node, and configured to control a second current flowing to the judging node according to a first bias current flowing through the fourth node; and a judging circuit connected with the judging node, and configured to generate an output data according to a judging voltage at the judging node.

25. The sensing apparatus as claimed in claim 24, wherein when the cell current in the data line is lower than the reference current in the sensing phase of the sense cycle, the voltage control circuit conducts the current in the one-way direction from the judging node to the third node, wherein when the cell current in the data line is higher than the reference current in the sensing phase of the sense cycle, the voltage control circuit electrically isolates the judging node from the third node.

* * * * *